United States Patent
Kim

(10) Patent No.: US 12,412,875 B2
(45) Date of Patent: Sep. 9, 2025

(54) SEMICONDUCTOR PACKAGE

(71) Applicant: SAMSUNG ELECTRONICS CO., LTD., Suwon-si (KR)

(72) Inventor: Seungmin Kim, Asan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 587 days.

(21) Appl. No.: 17/725,729

(22) Filed: Apr. 21, 2022

(65) Prior Publication Data

US 2023/0111555 A1 Apr. 13, 2023

(30) Foreign Application Priority Data

Oct. 8, 2021 (KR) .................. 10-2021-0134436

(51) Int. Cl.
*H01L 25/16* (2023.01)
*H01L 23/00* (2006.01)
*H01L 23/498* (2006.01)

(52) U.S. Cl.
CPC ........ *H01L 25/16* (2013.01); *H01L 23/49816* (2013.01); *H01L 23/49822* (2013.01);
(Continued)

(58) Field of Classification Search
CPC . H01L 2224/16111; H01L 2224/16225; H01L 2224/48091; H01L 2224/48227; H01L 2224/16227; H01L 2224/16237; H01L 2224/48228; H01L 2224/32013; H01L 2224/32054; H01L 2224/32059; H01L 2224/32104; H01L 2924/00014; H01L 2924/15192; H01L 2924/15311; H01L 2924/181; H01L 2924/19105;
(Continued)

(56) References Cited

U.S. PATENT DOCUMENTS 6,204,454 B1 * 3/2001 Gotoh ................. H01L 23/5383
428/209
8,076,776 B2 12/2011 Bhate et al.
(Continued)

FOREIGN PATENT DOCUMENTS

JP   H 9-055579 A    2/1997
KR   10-2014-0064417 A    5/2014
(Continued)

*Primary Examiner* — Sitaramarao S Yechuri
(74) *Attorney, Agent, or Firm* — Muir Patent Law, PLLC

(57) ABSTRACT

A semiconductor package includes a substrate having a passive element region, a peripheral region adjacent to the passive element region, and a remaining region, a first passive element on an upper surface of the passive element region, a first semiconductor chip on an upper surface of the remaining region, and a sealing portion covering the substrate, the first passive element, and the first semiconductor chip, wherein the peripheral region includes a first sub-region on a first side of the first passive element, a second sub-region on a second side opposite the first side, a third sub-region on a third side of the first passive element, and a fourth sub-region on a fourth side opposite the third side, and wherein a roughness of an upper surface of at least one of the first to fourth sub-regions is greater than a roughness of the upper surface of the remaining region.

20 Claims, 24 Drawing Sheets

(52) U.S. Cl.
CPC ........ *H01L 23/49838* (2013.01); *H01L 24/16* (2013.01); *H01L 24/48* (2013.01); *H01L 2224/16227* (2013.01); *H01L 2224/16237* (2013.01); *H01L 2224/48228* (2013.01); *H01L 2924/1431* (2013.01); *H01L 2924/1436* (2013.01); *H01L 2924/1438* (2013.01)

(58) Field of Classification Search
CPC ..... H01L 2924/1431; H01L 2924/1436; H01L 2924/1438; H01L 24/32; H01L 24/16; H01L 24/48; H01L 24/13; H01L 23/3128; H01L 23/49816; H01L 23/49822; H01L 23/49838; H01L 23/50; H01L 25/16; H01L 25/0655; H01L 25/0657
See application file for complete search history.

(56) References Cited

U.S. PATENT DOCUMENTS

| | | | |
|---|---|---|---|
| 8,709,879 B2 | 4/2014 | Park et al. | |
| 9,018,745 B2 | 4/2015 | Shimizu et al. | |
| 2005/0121310 A1* | 6/2005 | Yamada | H01L 21/563 204/192.12 |
| 2005/0285147 A1* | 12/2005 | Usui | H05K 1/185 257/E27.115 |
| 2007/0252249 A1* | 11/2007 | Murai | H01L 23/50 257/666 |
| 2012/0119358 A1* | 5/2012 | Oh | H01L 23/3142 257/737 |
| 2013/0203219 A1* | 8/2013 | Park | H01L 21/563 438/126 |
| 2016/0268188 A1* | 9/2016 | Kariya | H01L 23/3121 |
| 2020/0091102 A1* | 3/2020 | Aoki | H01L 24/20 |

FOREIGN PATENT DOCUMENTS

| | | |
|---|---|---|
| KR | 10-2014-0087541 A | 7/2014 |
| KR | 10-1762541 B1 | 7/2017 |

* cited by examiner

SEMICONDUCTOR PACKAGE

CROSS-REFERENCE TO RELATED APPLICATION

This application is based on and claims priority under 35 U.S.C. § 119 to Korean Patent Application No. 10-2021-0134436, filed on Oct. 8, 2021, in the Korean Intellectual Property Office, the disclosure of which is incorporated by reference herein in its entirety.

BACKGROUND

1. Field

Embodiments relate to a semiconductor package. In particular, embodiments relate to a semiconductor package including a passive element and a semiconductor chip.

2. Description of the Related Art

A solder paste may be used when a passive element is mounted on a package substrate. A passive element connecting member between the package substrate and the passive element and a flux layer on the package substrate may be made from the solder paste.

SUMMARY

According to an aspect of embodiments, there is provided a semiconductor package that may include a package substrate having a passive element region, a passive element adjacent region adjacent to the passive element region, and a remaining region; a first passive element on an upper surface of the passive element region; a first semiconductor chip on an upper surface of the remaining region; and a sealing portion covering the package substrate, the first passive element, and the first semiconductor chip, wherein the passive element adjacent region includes a first sub-region on a first side of the first passive element, a second sub-region on a second side opposite the first side of the first passive element, a third sub-region on a third side of the first passive element, and a fourth sub-region on a fourth side opposite the third side of the first passive element, and a roughness of an upper surface of at least one of the first sub-region to the fourth sub-region is greater than the roughness of an upper surface of the remaining region.

According to another aspect of embodiments, there is provided a semiconductor package that may include a package substrate having a wire pad, a wire pad, a wire pad adjacent region adjacent to the wire pad, and a remaining region; a passive element on an upper surface of the remaining region; a semiconductor chip on the upper surface of the remaining region; a wire electrically connecting the semiconductor chip to the wire pad; and a sealing portion covering the package substrate, the passive element, the semiconductor chip, and the wire, wherein the roughness of an upper surface of the wire pad adjacent region is less than the roughness of the upper surface of the remaining region.

According to another aspect of embodiments, there is provided a semiconductor package that may include a package substrate having a passive element region, a passive element adjacent region adjacent to the passive element region, and a remaining region; a plurality of external connection terminals on a lower surface of the package substrate; a passive element on an upper surface of the passive element region; a memory controller chip on the upper surface of the remaining region; a chip bump connecting the memory controller chip to the package substrate; a memory chip on the memory controller chip or the remaining region; a wire connecting the memory chip to the package substrate; and a sealing portion covering the package substrate, the passive element, the memory controller chip, the chip bump, the memory chip, and the wire, wherein the passive element adjacent region includes a first sub-region on a first side of the first passive element, a second sub-region on a second side opposite the first side of the first passive element, a third sub-region on a third side of the first passive element, and a fourth sub-region on a fourth side opposite the third side of the first passive element, and the roughness of the upper surface of at least one of the first sub-region to the fourth sub-region is greater than the roughness of the upper surface of the remaining region.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
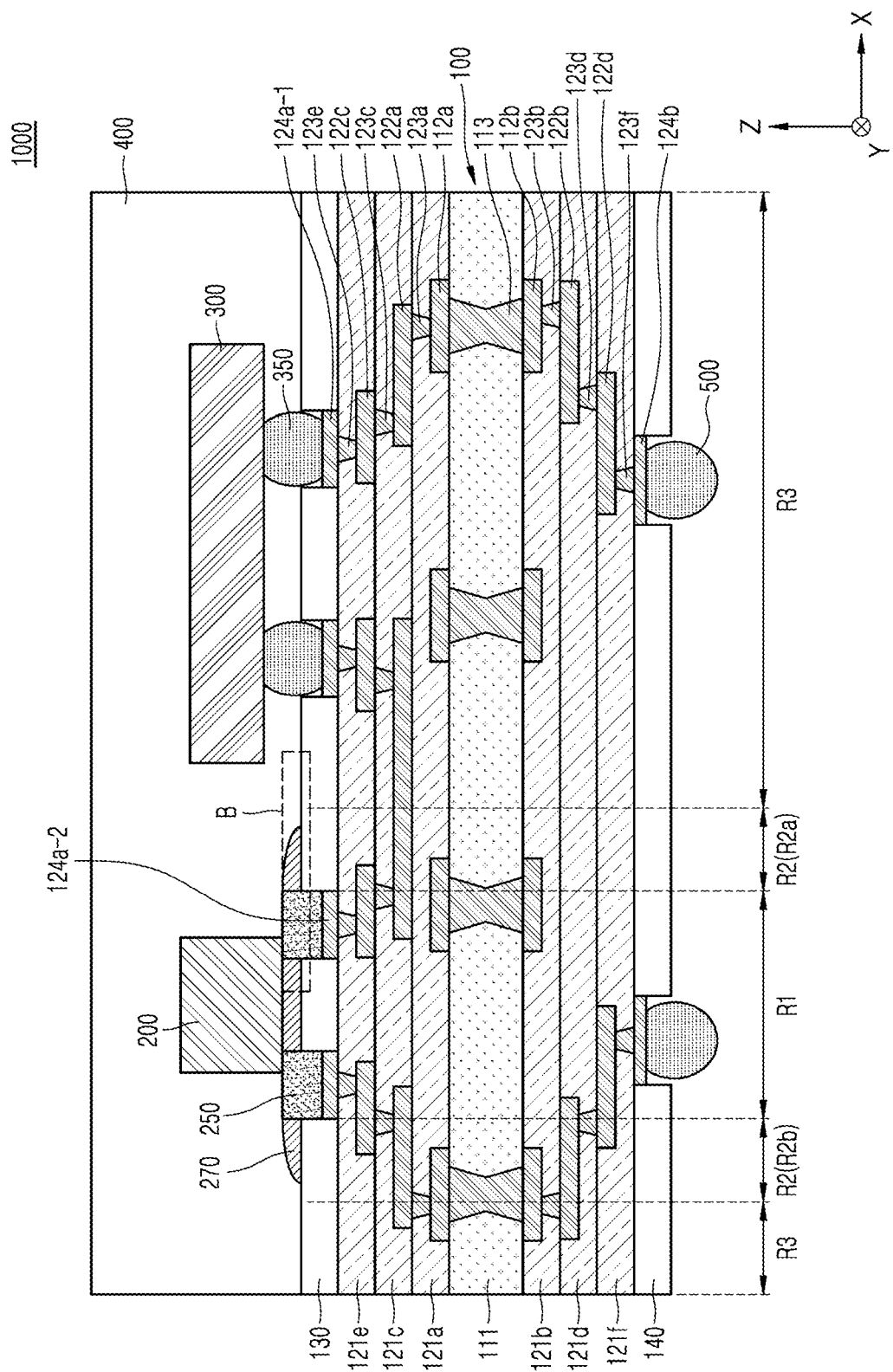
FIG. 1A is a cross-sectional view of a semiconductor package according to an embodiment.
Figure 1B:
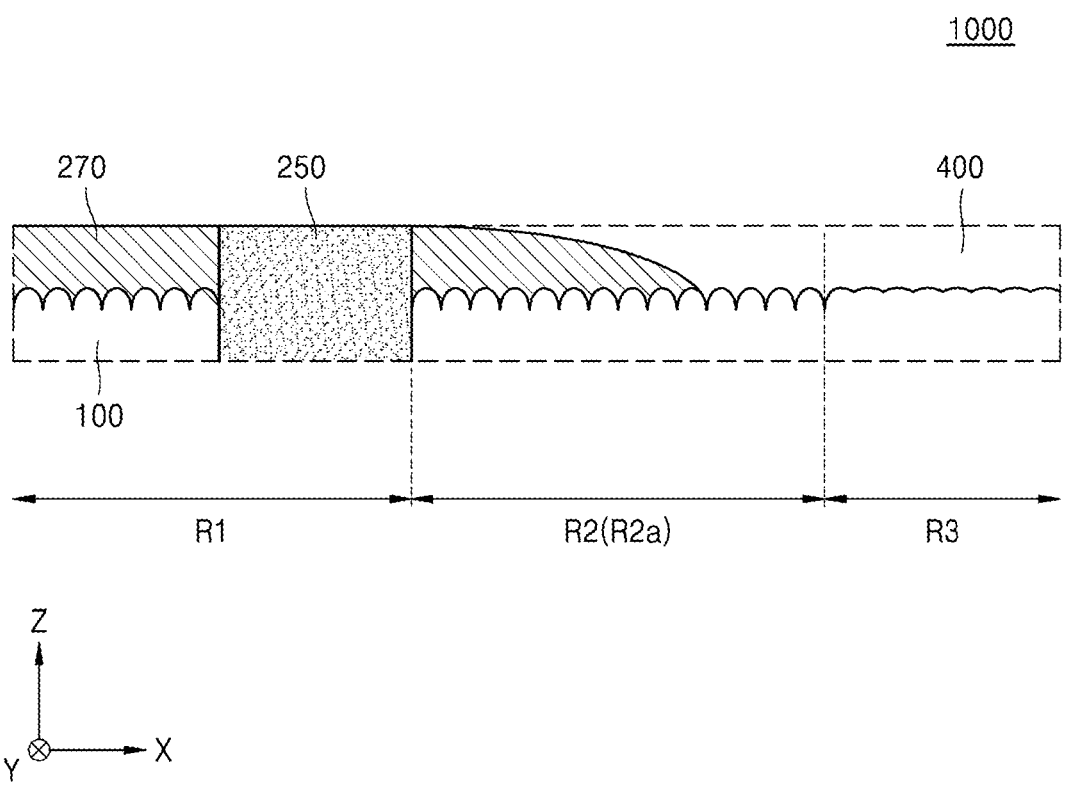
FIG. 1B is an enlarged view of region B in FIG. 1A.

FIG. 1A is a cross-sectional view showing a semiconductor package 1000 according to an embodiment. FIG. 1B is an enlarged view of region B in FIG. 1A, and FIG. 1C is a plan view showing the semiconductor package 1000 according to an embodiment.

Figure 1C:
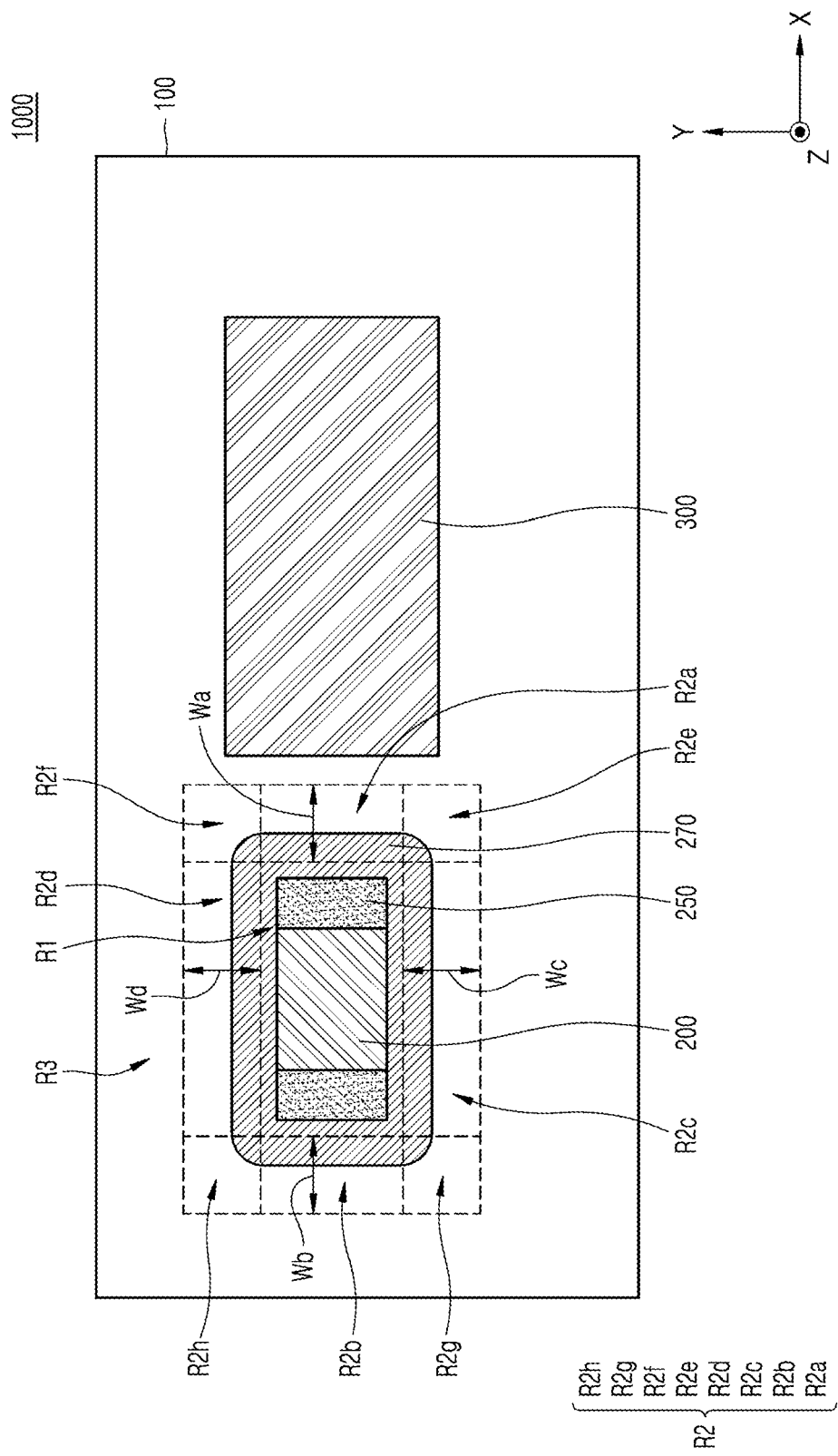
FIG. 1C is a plan view of a semiconductor package according to an embodiment.

Referring to FIGS. 1A to 1C, the semiconductor package 1000 may include a package substrate 100, a plurality of external connection terminals 500 on a lower surface of the package substrate 100, a passive element 200 on an upper surface of the package substrate 100, a plurality of passive element connecting members 250 for connecting the passive element 200 to the package substrate 100, a semiconductor chip 300 on the upper surface of the package substrate 100, a plurality of chip bumps 350 connecting the semiconductor chip 300 to the package substrate 100, and a sealing portion 400 covering the semiconductor chip 300. In some embodiments, the semiconductor package 1000 may further include a flux layer 270 on the package substrate 100.

The package substrate 100 may include a printed circuit board (PCB). For example, the package substrate 100 may include a core layer 111, a first insulating layer 121a on an upper surface of the core layer 111, a second insulating layer 121b on a lower surface of the core layer 111, a third insulating layer 121c on the upper surface of the first insulating layer 121a, a fourth insulating layer 121d on the lower surface of the second insulating layer 121b, a fifth insulating layer 121e on the upper surface of the third insulating layer 121c, and a sixth insulating layer 121f on the lower surface of the fourth insulating layer 121d. The package substrate 100 may further include a first protective layer 130 on an upper surface of the fifth insulating layer 121e and a second protective layer 140 on a lower surface of the sixth insulating layer 121f.

The package substrate 100 may further include a core via 113 penetrating the core layer 111. The package substrate 100 may further include a first core wiring layer 112a positioned on the upper surface of the core layer 111 and in contact with the core via 113. The package substrate 100 may further include a second core wiring layer 112b positioned on the lower surface of the core layer 111 and in contact with the core via 113.

The package substrate 100 may further include a first wiring layer 122a on the upper surface of the first insulating layer 121a. The package substrate 100 may further include a first via layer 123a passing through the first insulating layer 121a between the first wiring layer 122a and the first core wiring layer 112a. The package substrate 100 may further include a second wiring layer 122b on a lower surface of the second insulating layer 121b. The package substrate 100 may further include a second via layer 123b passing through the second insulating layer 121b between the second wiring layer 122b and the second core wiring layer 112b. The package substrate 100 may further include a third wiring layer 122c on the upper surface of the third insulating layer 121c. The package substrate 100 may further include a third via layer 123c passing through the third insulating layer 121c between the third wiring layer 122c and the first wiring layer 122a. The package substrate 100 may further include a fourth wiring layer 122d on the lower surface of the fourth insulating layer 121d. The package substrate 100 may further include a fourth via layer 123d passing through the fourth insulating layer 121d between the fourth wiring layer 122d and the second wiring layer 122b.

The package substrate 100 may further include a plurality of bump pads 124a-1 and a plurality of passive element pads 124a-2 on the upper surface of the fifth insulating layer 121e. The first protective layer 130 may have a plurality of openings exposing the plurality of bump pads 124a-1 and the plurality of passive element pads 124a-2, respectively. The package substrate 100 may further include a fifth via layer 123e passing through the fifth insulating layer 121e between the third wiring layer 122c and the plurality of bump pads 124a-1 and between the third wiring layer 122c and the plurality of passive element pads 124a-2. The package substrate 100 may further include a plurality of external connection terminal pads 124b on the lower surface of the sixth insulating layer 121f. The second protective layer 140 may have a plurality of openings exposing the plurality of external connection terminal pads 124b. The package substrate 100 may further include a sixth via layer 123f passing through the sixth insulating layer 121f between the fourth wiring layer 122d and the plurality of external connection terminal pads 124b.

In FIG. 1A, the package substrate 100 includes six insulating layers (i.e., the first to sixth insulating layers 121a to 121f), four wiring layers (i.e., the first to fourth wiring layers 122a to 122d), and six via layers (i.e., the first to sixth via layers 123a to 123f). However, the numbers of insulating layers, wiring layers, and via layers included in the package substrate 100 may be variously modified.

For example, the core layer 111 may include an insulating material, a thermosetting resin (e.g., an epoxy resin) or a thermoplastic resin (e.g., polyimide). The core layer 111 may include a material including a reinforcing material, e.g., fiberglass, and/or an inorganic filler, e.g., a copper clad laminate (CCL) or an unclad CCL. The core layer 111 may include a metal plate, a glass plate, or a ceramic plate.

The first to sixth insulating layers 121a to 121f may include a thermosetting resin, e.g., epoxy, or a thermoplastic resin, e.g., polyimide. In some embodiments, the first to sixth insulating layers 121a to 121f may include a material including a reinforcing material, e.g., glass fiber, and/or an inorganic filler in addition to a thermoplastic resin and/or a thermosetting resin, e.g., prepreg or Ajinomoto build-up film (ABF). In some embodiments, the first protective layer 130 and the second protective layer 140 may include solder resist.

The core via 113, the first and second core wiring layers 112a and 112b, the first to fourth wiring layers 122a to 122d, the first to sixth via layers 123a to 123f, the bump pads 124a-1, the passive element pads 124a-2, and the external connection terminal pads 124b may include a metal material. The metal material may include, e.g., copper (Cu), aluminum (Al), silver (Ag), tin (Sn), gold (Au), nickel (Ni), lead (Pb), titanium (Ti), or an alloy thereof.

As shown in FIG. 1C, the package substrate 100 may have a passive element region R1, a passive element adjacent region R2 adjacent to the passive element region R1, and a remaining region R3. For example, the passive element adjacent region R2 may be a peripheral region of the passive element region R1. In some embodiments, the passive element adjacent region R2 may surround, e.g., an entire perimeter of, the passive element region R1, and the remaining region R3 may surround, e.g., an entire perimeter of, the passive element adjacent region R2, as viewed in a top view (FIG. 1C).

The plurality of external connection terminals 500 may be respectively positioned on the plurality of external connection terminal pads 124b of the package substrate 100. Each of the external connection terminals 500 may include, e.g., tin (Sn) or a tin (Sn) alloy. In some embodiments, each external connection terminal 500 may be formed of a solder ball.

The passive element 200 may be located on the passive element region R1. The passive element 200 may be positioned on the plurality of passive element pads 124a-2 of the package substrate 100. The passive element 200 may be, e.g., a capacitor, an inductor, or a resistor.

The plurality of passive element connecting members 250 may be located between the passive element region R1 of the package substrate 100 and the passive element 200, e.g., the plurality of passive element connecting members 250 may be between the package substrate 100 and the passive element 200 along the Z direction. The plurality of passive element connecting members 250 may be located between the passive element 200 and the plurality of passive element pads 124a-2, respectively. The plurality of passive element connecting members 250 may include, e.g., tin (Sn) or tin (Sn) alloys. In some embodiments, a plurality of passive element connecting members 250 may be formed of a solder paste.

The semiconductor chip 300 may be located on the remaining region R3. The semiconductor chip 300 may be located on the plurality of bump pads 124a-1 of the package substrate 100. The semiconductor chip 300 may include an arbitrary kind of integrated circuit including, e.g., a memory circuit, a logic circuit, or a combination thereof. The memory circuit may be, e.g., a dynamic random access memory (DRAM) circuit, a static random access memory (SRAM) circuit, a flash memory circuit, an electrically erasable and programmable read-only memory (EEPROM) circuit, a phase-change random access memory (PRAM) circuit, a magnetic random access memory (MRAM) circuit, a resistive random access memory (RRAM) circuit, or a combination thereof. The logic circuit may be, e.g., a central processing unit (CPU) circuit, a graphics processing unit (GPU) circuit, a memory controller circuit, an application specific integrated circuit (ASIC) circuit, an application processor (AP) circuit, or a combination thereof.

The chip bumps 350 may be located between the remaining region R3 of the package substrate 100 and the semiconductor chip 300, e.g., the chip bumps 350 may be between the package substrate 100 and the semiconductor chip 300 along the Z direction. The chip bumps 350 may be located between the semiconductor chip 300 and the plurality of bump pads 124a-1, respectively. The chip bumps 350 may include, e.g., a tin (Sn) or a tin (Sn) alloy. In some embodiments, the chip bump 350 may be formed of a solder ball.

The sealing portion 400 may cover the package substrate 100, the passive element 200, and the semiconductor chip 300. The sealing portion 400 may include an epoxy resin. For example, the sealing portion 400 may include an epoxy mold compound (EMC).

The flux layer 270 may be located on the passive element adjacent region R2. In some embodiments, the flux layer 270 may be further positioned on the passive element region R1. In some embodiments, the flux layer 270 may be formed of flux of solder paste.

Referring to FIG. 1C, the passive element adjacent region R2 may include a first sub-region R2a on the first side of the passive element 200, a second sub-region R2b on a second side opposite to the first side of the passive element 200, a third sub-region R2c on a third side of the passive element 200, and a fourth sub-region R2d of a fourth side opposite to the third side of the passive element 200. In some embodiments, the passive element adjacent region R2 may further include a fifth sub-region R2e in which the first sub-region R2a intersects with the third sub-region R2c, a sixth sub-region R2f in which the first sub-region R2a intersects with the fourth sub-region R2d, a seventh sub-region R2g in which the third sub-region R2c intersects with the second sub-region R2b, and an eighth sub-region R2h in which the fourth sub-region R2d intersects with the second sub-region R2b. In some embodiments, e.g., each of, the width Wa of the first sub-region R2a, the width Wb of the second sub-region R2b, the width Wc of the third sub-region R2c, and the width Wd of the fourth sub-region R2d may be about 10 μm to about 500 μm.

In some embodiments, the roughness of the upper surface of the first sub-region R2a to the fourth sub-region R2d may be greater than the roughness of the upper surface of the remaining region R3. For example, referring to FIG. 1B, the roughness of the upper surface, i.e., a surface facing the passive element 200, of the first sub-region R2a to the fourth sub-region R2d may be greater than the roughness of the upper surface, i.e., a surface facing the semiconductor chip 300, of the remaining region R3.

In this specification, roughness means average roughness (roughness average, Ra). In some embodiments, the roughness of the upper surface of the first sub-region R2a to the fourth sub-region R2d may be greater than the roughness of the upper surface of the remaining region R3 by about 80 nm or more. In some embodiments, the roughness of the upper surface of the fifth sub-region R2e to the eighth sub-region R2h may be greater than the roughness of the upper surface of the remaining region R3. In some embodiments, the roughness of the upper surface of the fifth sub-region R2e to the eighth sub-region R2h may be greater than the roughness of the upper surface of the remaining region R3 by about 80 nm or more.

The greater the roughness of the surface through which the flux flows, the wider the flux may flow. Because the passive element adjacent region R2 has a rough surface, the flux layer 270 may be formed wider on the passive element adjacent region R2. Accordingly, the concentration of the flux mixed in the sealing portion 400 may be reduced. Therefore, the possibility of delamination caused by combining the sealing portion 400 with the flux layer 270 may be reduced. On the other hand, by forming the remaining region R3 to be relatively flat, i.e., a lower surface roughness, the flow of the flux layer 270 to the remaining region R3 may be reduced. Therefore, the flux layer 270 may be prevented from contaminating the bump pads 124a-1 located in the remaining region R3.

In some embodiments, the roughness of the upper surface of the passive element region R1 may be greater than the roughness of the upper surface of the remaining region R3. For example, the roughness of the upper surface of the passive element region R1 may be greater than the roughness of the upper surface of the remaining region R3 by about 80 nm or more.

Figure 2:
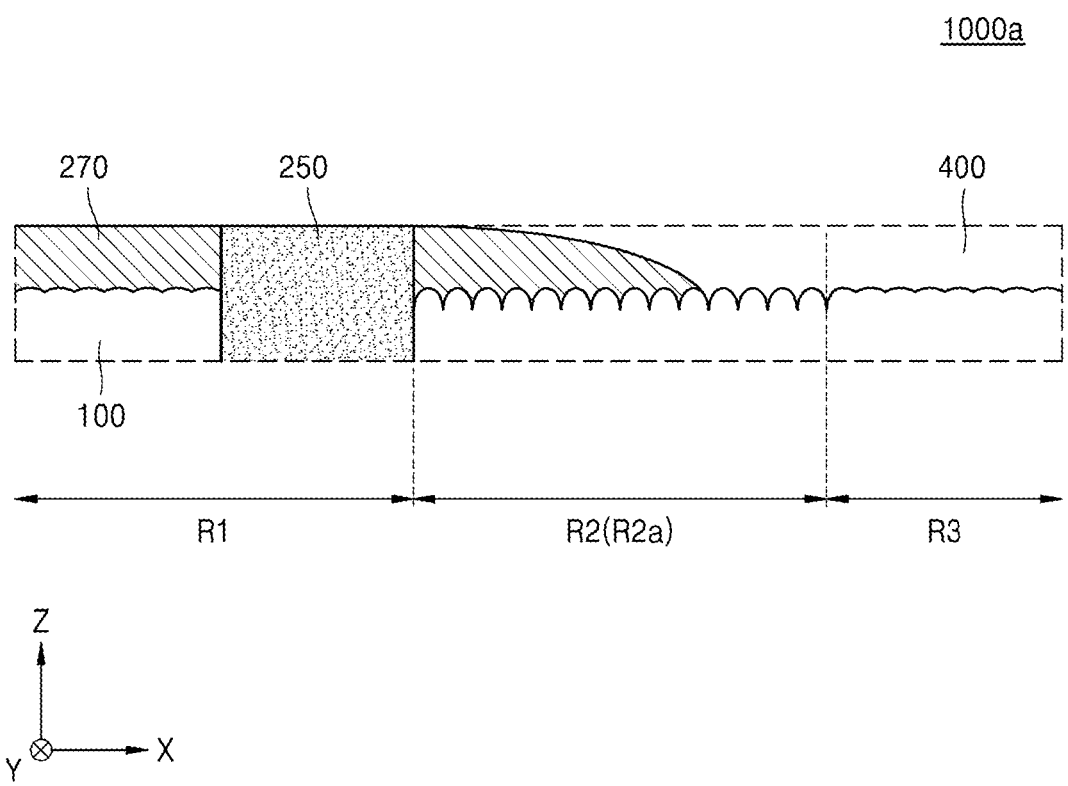
FIG. 2 is a cross-sectional view of a semiconductor package according to an embodiment.

FIG. 2 is a cross-sectional view showing a semiconductor package 1000a according to an embodiment. Hereinafter, differences between the semiconductor package 1000 shown in FIG. 1A to 1C and the semiconductor package 1000a shown in FIG. 2 are described.

Referring to FIG. 2, the roughness of the upper surface of the passive element region R1 may be less than the roughness of the upper surface of the passive element adjacent region R2. For example, the roughness of the upper surface of the passive element region R1 may be less than the roughness of the upper surface of the first sub-region R2a. For example, the roughness of the upper surface of the passive element region R1 may be less than the roughness of the upper surface of the passive element adjacent region R2 by about 80 nm or more. The roughness of the upper surface of the passive element region R1 may be less than the roughness of the upper surface of the second to fourth sub regions (refer to R2b to R2d, and FIG. 1C). For example, the roughness of the upper surface of the passive element region R1 may be less than the roughness of the upper surface of the upper surface of the second to fourth sub regions R2b to R2d (refer to FIG. 1C) by about 80 nm or more.

Figure 3:
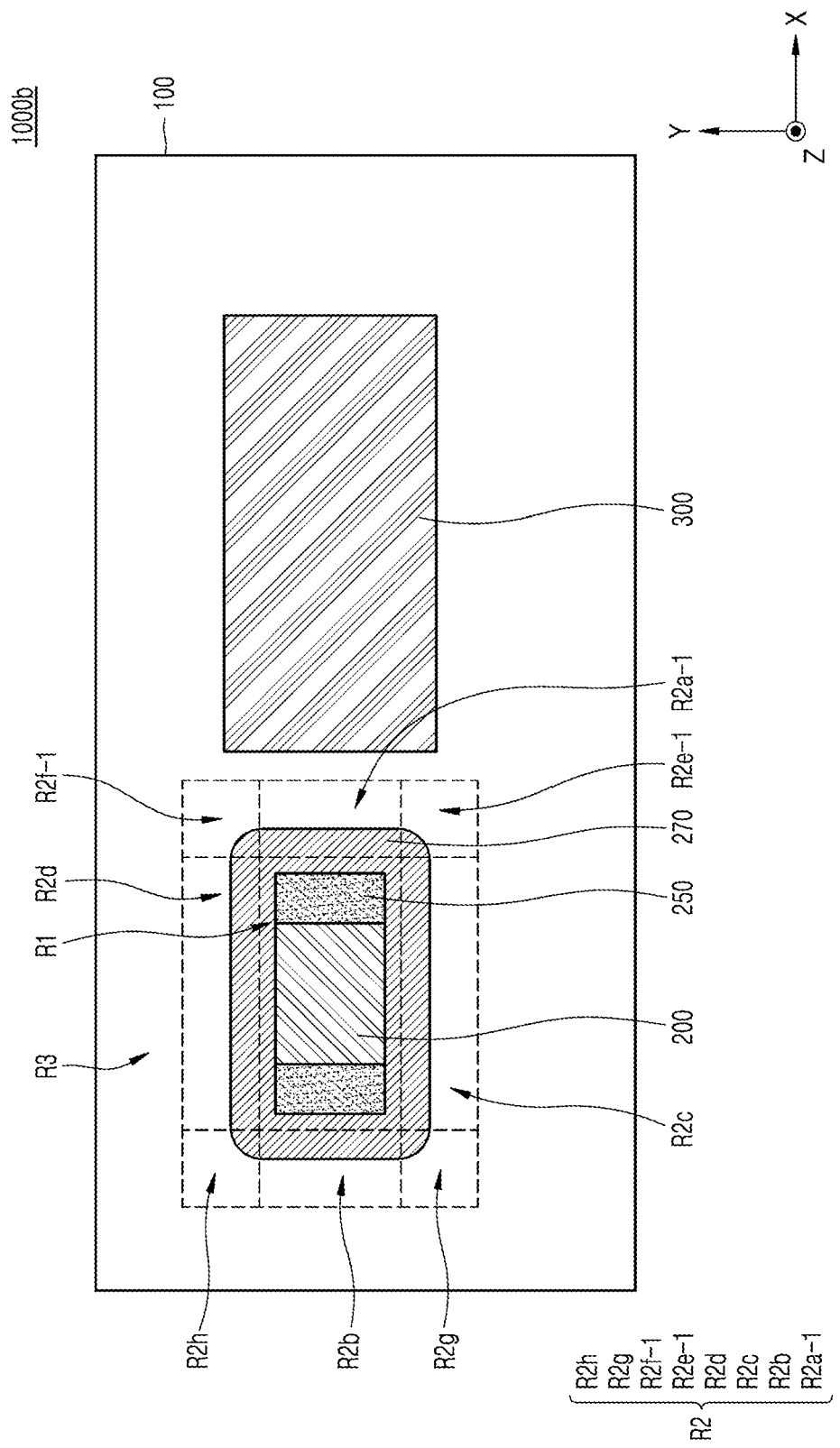
FIG. 3 is a plan view of a semiconductor package according to an embodiment.

FIG. 3 is a plan view showing a semiconductor package 1000b according to an embodiment. Hereinafter, differences between the semiconductor package 1000 shown in FIGS. 1A to 1C and the semiconductor package 1000b shown in FIG. 3 are described.

Referring to FIG. 3, the roughness of an upper surface of a first sub-region R2a-1 may be less than the roughness of an upper surface of a second sub-region R2b to a fourth sub-region R2d. For example, the roughness of the upper surface of the first sub-region R2a-1 may be less than the roughness of the upper surface of the second sub-region R2b to the fourth sub-region R2d by 80 nm or more.

In some embodiments, the roughness of upper surfaces of a fifth sub-region R2e-1 and a sixth sub-region R2f-1 may be less than roughness of the upper surfaces of a seventh sub-region R2g and an eighth sub-region R2h. For example, the roughness of the upper surface of the fifth sub-region R2e-1 and the sixth sub-region R2f-1 may be less than the roughness of the upper surface of the seventh sub-region R2g and the eighth sub-region R2h by 80 nm or more By forming the first sub-region R2a-1, the fifth sub-region R2e-1, and the sixth sub-region R2f-1 to be relatively flat, the flow of the flux layer 270 to the first side of the passive element 200 may be reduced. Accordingly, the flux layer 270 may be prevented from contaminating the bump pad 124a-1 (refer to FIG. 1A) under the semiconductor chip 300 positioned on the first side of the passive element 200.

Figure 4:
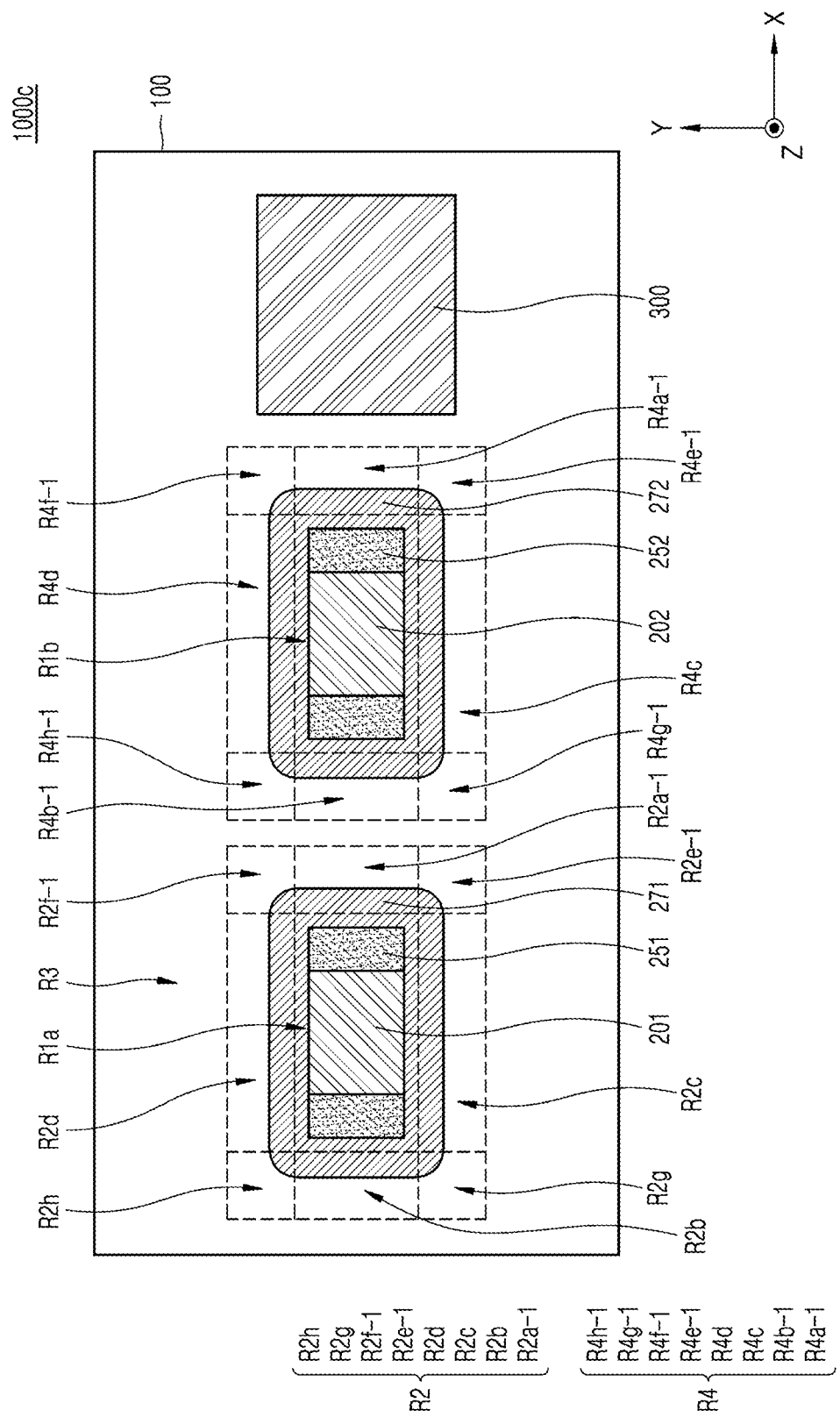
FIG. 4 is a plan view of a semiconductor package according to an embodiment.

FIG. 4 is a plan view showing a semiconductor package 1000c according to an embodiment. Hereinafter, differences between the semiconductor packages 1000 shown in FIGS. 1A to 1C and the semiconductor package 1000c shown in FIG. 4 are described.

Referring to FIG. 4, the semiconductor package 1000c may include the package substrate 100, a first passive element 201, a first passive element connecting member 251, a first flux layer 271, a second passive element 202, a second passive element connecting member 252, a second flux layer 272, and the semiconductor chip 300. The package substrate 100 may include a first passive element region R1a, a first passive element adjacent region R2 adjacent to the first passive element region R1a, a second passive element region R1b positioned on the first side of the first passive element region R1a, a second passive element adjacent region R4 adjacent to the second passive element region R1b, and a remaining region R3. The first passive element 201 may be located on the first passive element region R1a, and the second passive element 202 may be located on the second passive element region R1b, and the semiconductor chip 300 may be located on the remaining region R3. A plurality of first passive element connecting members 251 may connect the first passive element 201 to the package substrate 100, and a plurality of second passive element connecting members 252 may connect the second passive element 202 to the package substrate 100. The first flux layer 271 may be located on the first passive element region R1a and the first passive element adjacent region R2, and the second flux layer 272 may be located on the second passive element region R1b and the second passive element adjacent region R4.

The first passive element adjacent region R2 may include a first sub-region R2a-1 on a first side of the first passive element 201, a second sub-region R2b on a second side opposite to the first side of the first passive element 201, a third sub-region R2c on a third side of the first passive element 201, and the fourth sub-region R2d on a fourth side opposite to the third side of the first passive element 201. In some embodiments, the first passive element adjacent region R2 may further include a fifth sub-region R2e-1 in which the first sub-region R2a-1 intersects with the third sub-region R2c, a sixth sub-region R2f-1 in which the first sub-region R2a-1 intersects with the fourth sub-region R2d, a seventh sub-region R2g in which the third sub-region R2c intersects with the second sub-region R2b, and an eighth sub-region R2h in which the fourth sub-region R2d intersects with the second sub-region R2b.

The second passive element 202 may be located on the first side of the first passive element 201, e.g., the second passive element 202 may be between the first passive element 201 and the semiconductor chip 300 along the X direction. In this case, the roughness of the upper surface of the first sub-region R2a-1 of the first passive element adjacent region R2 may be less than the roughness of the upper surfaces of the second sub-region R2b to the fourth sub-region R2d of the first passive element adjacent region R2. For example, the roughness of the upper surface of the first sub-region R2a-1 of the first passive element adjacent region R2 may be less than that of the upper surface of the second sub-region R2b to the fourth sub-region R2d of the first passive element adjacent region R2 by 80 nm or more.

The roughness of the upper surfaces of the fifth sub-region R2e-1 and the sixth sub-region R2f-1 of the first passive element adjacent region R2 may be less than the roughness of the upper surfaces of the seventh sub-region R2g and the eighth sub-region R2h of the first passive element adjacent region R2. For example, the roughness of upper surfaces of the fifth sub-region R2e-1 and the sixth sub-region R2f-1 of the first passive element adjacent region R2 may be less than the roughness of upper surfaces of the seventh sub-region R2g and the eighth sub-region R2h of the first passive element adjacent region R2 by 80 nm or more.

By forming the first sub-region R2a-1, the fifth sub-region R2e-1, and the sixth sub-region R2f-1 of the first passive element adjacent region R2 relatively flat, the flow of the first flux layer 271 to the first side of the first passive element 201 may be reduced. Accordingly, the first flux layer 271 may be prevented from meeting, e.g., contacting, the second flux layer 272. Therefore, it is possible to prevent an increase in the concentration of the flux mixed with the sealing portion 400 (refer to FIG. 1A). Accordingly, it is possible to prevent delamination between the sealing portion 400 (refer to FIG. 1A) and the package substrate 100.

The second passive element adjacent region R4 may include a first sub-region R4a-1 on a first side of the second passive element 202, a second sub-region R4b-1 on a second side opposite to the first side of the second passive element 202, a third sub-region R4c on a third side of the second passive element 202, and a fourth sub-region R4d on a fourth side opposite to the third side of the second passive element 202. In some embodiments, the second passive element adjacent region R4 may further include a fifth sub-region R4e-1 in which the first sub-region R4a-1 intersects with the third sub-region R4c, a sixth sub-region R4f-1 in which the first sub-region R4a-1 intersects with the fourth sub-region R4d, a seventh sub-region R4g-1 in which the third sub-region R4c intersects with the second sub-region R4b-1, and an eighth sub-region R4h-1 in which the fourth sub-region R4d intersects with the second sub-region R4b-1.

The first passive element 201 may be positioned on the second side of the second passive element 202, and the semiconductor chip 300 may be positioned on the first side of the second passive element 202. In this case, the roughness of the upper surfaces of the first sub-region R4a-1 and the second sub-region R4b-1 of the second passive element adjacent region R4 may be less than the roughness of the upper surfaces of the third sub-region R4c and the fourth sub-region R4d of the second passive element adjacent region R4. For example, the roughness of upper surfaces of the first sub-region R4a-1 and the second sub-region R4b-1 of the second passive element adjacent region R4 may be less than the roughness of the upper surfaces of the third sub-region R4c and the fourth sub-region R4d of the second passive element adjacent region R4 by 80 nm or more.

The roughness of upper surfaces of the fifth sub-region R4e-1 to the eighth sub-region R4h-1 of the second passive element adjacent region R4 may be less than the roughness of the upper surfaces of the third sub-region R4c and the fourth sub-region R4d of the second passive element adjacent region R4. For example, the roughness of upper surfaces of the fifth sub-region R4e-1 to the eighth sub-region R4h-1 of the second passive element adjacent region R4 may less than the roughness of the upper surfaces of the third sub-region R4c and the fourth sub-region R4d of the second passive element adjacent region R4 by 80 nm or more.

By forming the first sub-region R4a-1, the fifth sub-region R4e-1, and the sixth sub-region R4f-1 of the second passive element adjacent region R4 to be relatively flat, the flow of the second flux layer 272 to the first side of the second passive element 202 may be reduced. Accordingly, the second flux layer 272 may be prevented from contaminating the bump pad 124a-1 (refer to FIG. 1A) under the semiconductor chip 300 positioned on the first side of the second passive element 202.

By forming the second sub-region R4b-1, the seventh sub-region R4g-1, and the eighth sub-region R4h-1 of the second passive element adjacent region R4 to be relatively flat, the flow of the second flux layer 272 to the second side of the second passive element 202 may be reduced. Accordingly, the second flux layer 272 may be prevented from meeting, e.g., contacting, the first flux layer 271. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 5:
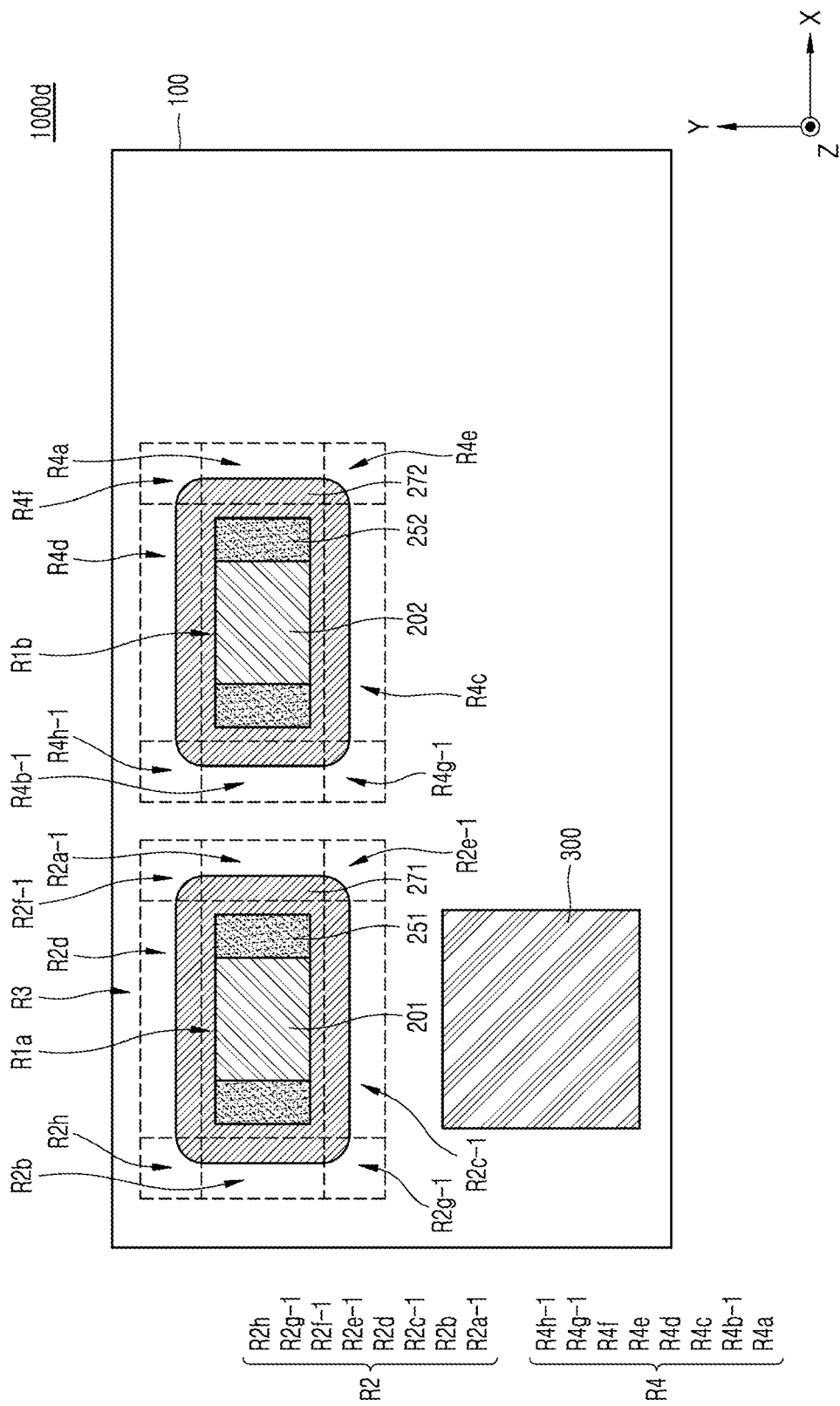
FIG. 5 is a plan view of a semiconductor package according to an embodiment.

FIG. 5 is a plan view showing a semiconductor package 1000d according to an embodiment. Hereinafter, differences between the semiconductor package 1000c shown in FIG. 4 and the semiconductor package 1000d shown in FIG. 5 are described.

Referring to FIG. 5, the semiconductor chip 300 may be positioned on a third side of the first passive element 201, e.g., the semiconductor chip 300 and the first passive element 201 may be adjacent to each other along the Y direction, and the second passive element 202 may be positioned on a first side of the first passive element 201, e.g., the first and second passive elements 201 and 202 may adjacent to each other along the X direction. In other words, the semiconductor chip 300 and the second passive element 202 may be positioned on adjacent (rather than opposite) sides of the first passive element 201. In this case, the roughness of upper surfaces of a first sub-region R2a-1 and a third sub-region R2c-1 of a first passive element adjacent region R2 may be less than the roughness of upper surfaces of a second sub-region R2b and a fourth sub-region R2d of the first passive element adjacent region R2. For example, the roughness of upper surfaces of the first sub-region R2a-1 and the third sub-region R2c-1 of the first passive element adjacent region R2 may be less than the roughness of upper surfaces of the second sub-region R2b and the fourth sub-region R2d of the first passive element adjacent region R2 by 80 nm or more.

In some embodiments, the roughness of upper surfaces of a fifth sub-region Re-1 to a seventh sub-region R2g-1 of the first passive element adjacent region R2 may be less than the roughness of the upper surface of an eighth sub-region R2h of the first passive element adjacent region R2. For example, the roughness of upper surfaces of the fifth sub-region Re-1 to the seventh sub-region R2g-1 of the first passive element adjacent region R2 may be less than the roughness of the upper surface of the eighth sub-region R2h of the first passive element adjacent region R2 by 80 nm or more.

By forming the first sub-region R2a-1, the fifth sub-region R2e-1, and the sixth sub-region R2f-1 of the first passive element adjacent region R2 relatively flat, the flow of the first flux layer 271 to the first side of the first passive element 201 may be reduced. Accordingly, the first flux layer 271 may be prevented from meeting, e.g., contacting, the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming the third sub-region R2c-1, the fifth sub-region R2e-1, and the seventh sub-region R2g-1 of the first passive element adjacent region R2 to be relatively flat, the first flux layer 271 may be prevented from contaminating the bump pad 124a-1 (refer to FIG. 1A) under the semiconductor chip 300 positioned on the third side of the first passive element 201.

The first passive element 201 may be located on a second side of the second passive element 202. In this case, the roughness of the upper surface of the second sub-region R4b-1 of the second passive element adjacent region R4 may be less than the roughness of upper surfaces of the first sub-region R4a, the third sub-region R4c, and the fourth sub-region R4d. For example, the roughness of the upper surface of the second sub-region R4b-1 of the second passive element adjacent region R4 may be less than the roughness of upper surfaces of the first sub-region R4a, the third sub-region R4c, and the fourth sub-region R4d by about 80 nm or more.

In some embodiments, the roughness of upper surfaces of a seventh sub-region R4g-1 and an eighth sub-region R4h-1 of the second passive element adjacent region R4 may be less than the roughness of upper surfaces of a fifth sub-region R4e and a sixth sub-region R4f of the second passive element adjacent region R4. For example, the roughness of upper surfaces of the seventh sub-region R4g-1 and the eighth sub-region R4h-1 of the second passive element adjacent region R4 may be less than the roughness of upper surfaces of the fifth sub-region R4e and the sixth sub-region R4f of the second passive element adjacent region R4 by about 80 nm or more.

By forming the second sub-region R4b-1, the seventh sub-region R4g-1, and the eighth sub-region R4h-1 of the second passive element adjacent region R4 to be relatively flat, the flow of the second flux layer 272 to the second side of the second passive element 202 may be reduced. Accordingly, the second flux layer 272 may be prevented from meeting, e.g., contacting, the first flux layer 271. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 6:
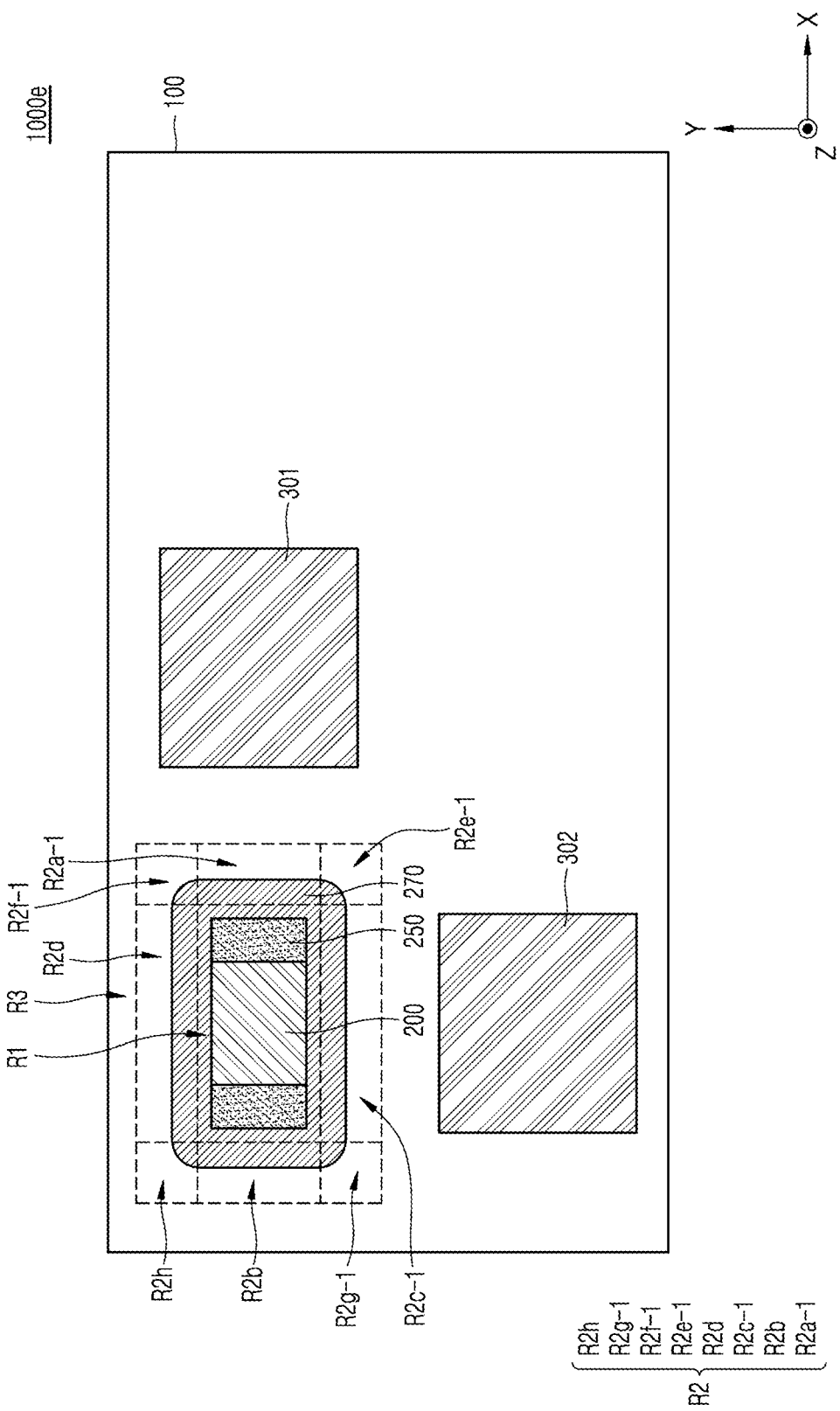
FIG. 6 is a plan view of a semiconductor package according to an embodiment.

FIG. 6 is a plan view showing a semiconductor package 1000e according to an embodiment. Hereinafter, differences between the semiconductor package 1000 shown in FIGS. 1A to 1C and the semiconductor package 1000e shown in FIG. 6 are described.

Referring to FIG. 6, the semiconductor package 1000e may include a first semiconductor chip 301 and a second semiconductor chip 302 on the remaining region R3 of the package substrate 100 (instead of the single semiconductor chip 300 illustrated in FIGS. 1A to 1C). The first semiconductor chip 301 may be located on a first side of a passive element 200, and the second semiconductor chip 302 may be located on a third side of the passive element 200.

In this case, the roughness of upper surfaces of a first sub-region R2a-1 and a third sub-region R2c-1 of the first passive element adjacent region R2 may be less than the roughness of upper surfaces of a second sub-region R2b and a fourth sub-region R2d of the first passive element adjacent region R2. For example, the roughness of upper surfaces of the first sub-region R2a-1 and the third sub-region R2c-1 of the first passive element adjacent region R2 may be less than the roughness of upper surfaces of the second sub-region R2b and the fourth sub-region R2d of the first passive element adjacent region R2 by 80 nm or more.

In some embodiments, the roughness of upper surfaces of a fifth sub-region R2e-1 to a seventh sub-region R2g-1 of the first passive element adjacent region R2 may be less than the roughness of the upper surface of an eighth sub-region R2h of the first passive element adjacent region R2. For example, the roughness of the upper surfaces of the fifth sub-region R2e-1 to the seventh sub-region R2g-1 of the first passive element adjacent region R2 may be less than the roughness of the upper surface of the eighth sub-region R2h of the first passive element adjacent region R2 by 80 nm or more.

By forming the first sub-region R2a-1, the fifth sub-region R2e-1, and the sixth sub-region R2f-1 of the first passive element adjacent region R2 relatively flat, the flow of the first flux layer 271 to a first side of the first passive element 201 may be reduced. Accordingly, the first flux layer 271 may be prevented from contaminating the bump pad 124a-1 (refer to FIG. 1A) under the first semiconductor chip 301 positioned on the first side of the first passive element 201.

By forming the third sub-region R2c-1, the fifth sub-region R2e-1, and the seventh sub-region R2g-1 of the first passive element adjacent region R2 to be relatively flat, the first flux layer 271 may be prevented from contaminating the bump pad 124a-1 (refer to FIG. 1A) under the second semiconductor chip 302 positioned on a third side of the first passive element 201.

Figure 7:
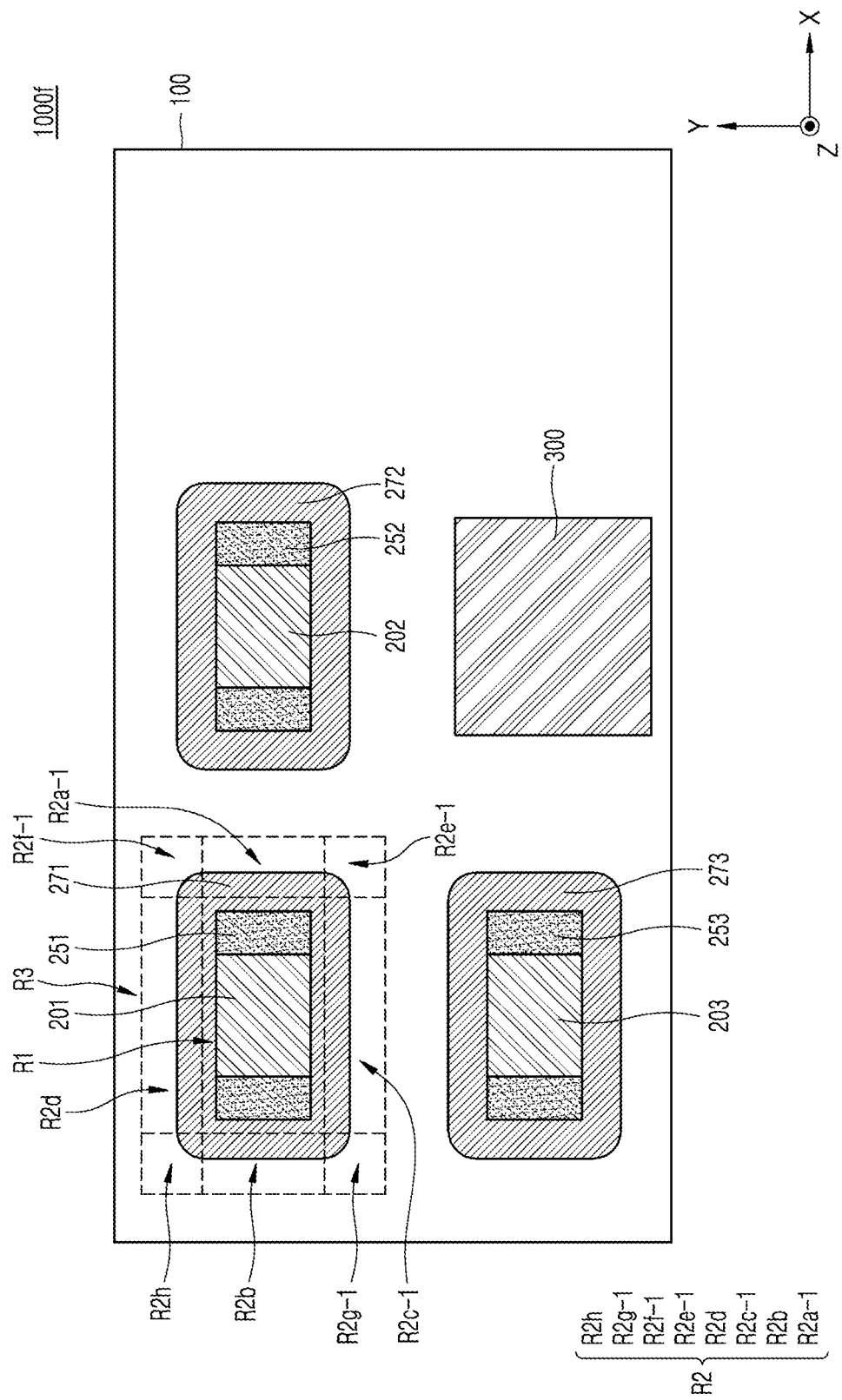
FIG. 7 is a plan view of a semiconductor package according to an embodiment.

FIG. 7 is a plan view showing a semiconductor package 1000f according to an embodiment. Hereinafter, differences between the semiconductor package 1000d shown in FIG. 5 and the semiconductor package 1000f shown in FIG. 7 are described.

Referring to FIG. 7, the semiconductor package 1000f may further include a third passive element 203, a third passive element connecting member 253 connecting the third passive element 203 to the package substrate 100, and a third flux layer 273 adjacent to the third passive element 203 on the package substrate 100.

The second passive element 202 may be located on the first side of the first passive element 201, and the third passive element 203 may be located on the third side of the first passive element 201. In this case, the roughness of the upper surfaces of a first sub-region R2a-1 and a third sub-region R2c-1 of the first passive element adjacent region R2 may be less than the roughness of upper surfaces of a second sub-region R2b and a fourth sub-region R2d of the first passive element adjacent region R2. For example, the roughness of upper surfaces of the first sub-region R2a-1 and the third sub-region R2c-1 of the first passive element adjacent region R2 may be less than the roughness of upper surfaces of the second sub-region R2b and the fourth sub-region R2d of the first passive element adjacent region R2 by 80 nm or more.

In some embodiments, the roughness of upper surfaces of a fifth sub-region Re-1 to a seventh sub-region R2g-1 of the first passive element adjacent region R2 may be less than the roughness of the upper surface of an eighth sub-region R2h of the first passive element adjacent region R2. For example, the roughness of upper surfaces of the fifth sub-region Re-1 to the seventh sub-region R2g-1 of the first passive element adjacent region R2 may be less than the roughness of the upper surface of the eighth sub-region R2h of the first passive element adjacent region R2 by 80 nm or more.

By forming the first sub-region R2a-1, the fifth sub-region R2e-1, and the sixth sub-region R2f-1 of the first passive element adjacent region R2 relatively flat, the flow of the first flux layer 271 to the first side of the first passive element 201, e.g., along the X direction, may be reduced. Accordingly, the first flux layer 271 may be prevented from meeting, e.g., contacting, the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming the third sub-region R2c-1, the fifth sub-region R2e-1, and the seventh sub-region R2g-1 of the first passive element adjacent region R2 to be relatively flat, the flow of the first flux layer 271 to the third side of the first passive element 201, e.g., along the Y direction, may be reduced. Accordingly, the first flux layer 271 may be prevented from meeting, e.g., contacting, the third flux layer 273. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 8:
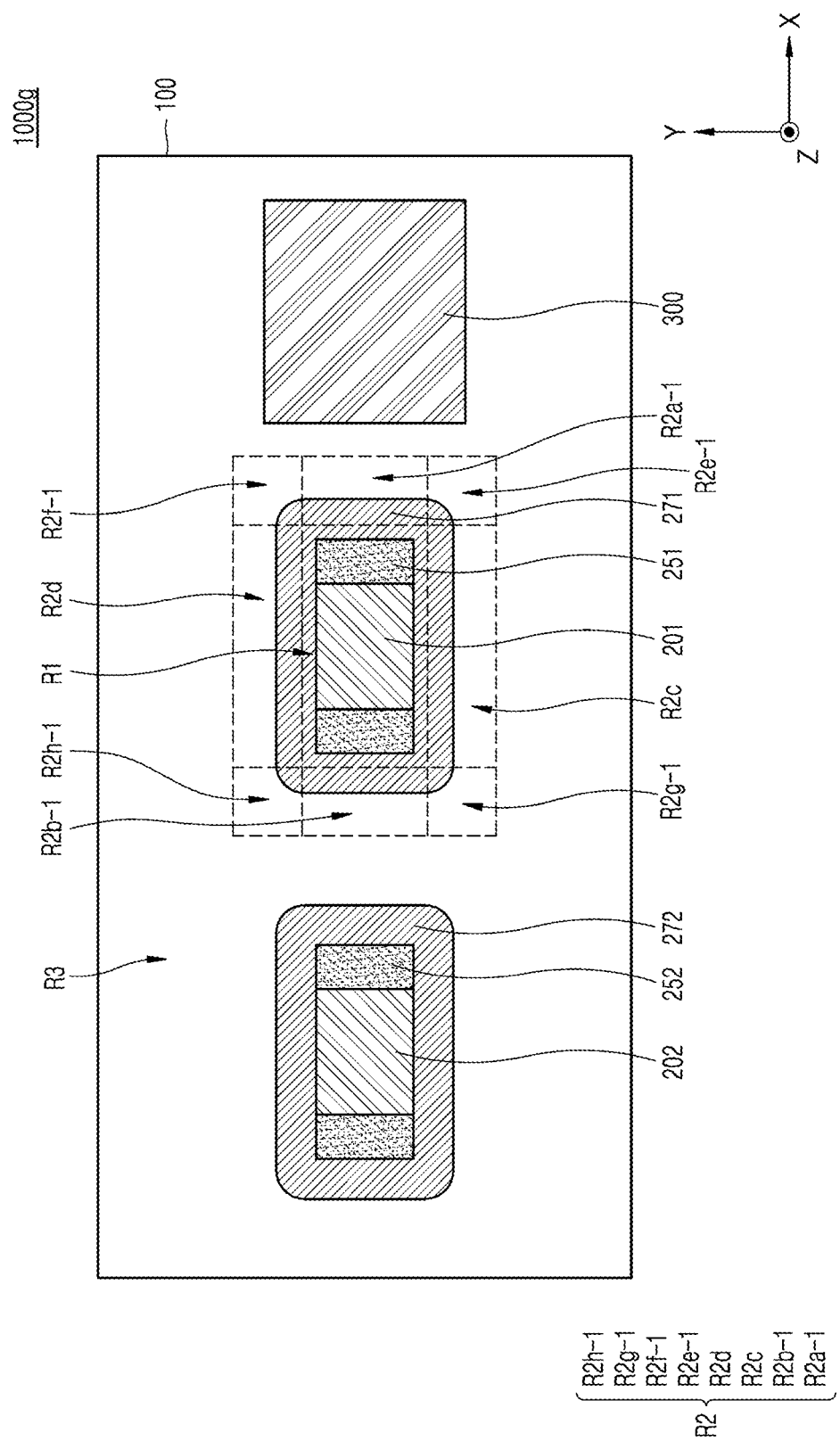
FIG. 8 is a plan view of a semiconductor package according to an embodiment.

FIG. 8 is a plan view showing a semiconductor package 1000g according to an embodiment. Hereinafter, differences between the semiconductor package 1000c shown in FIG. 4 and the semiconductor package 1000g shown in FIG. 8 are described.

Referring to FIG. 8, the second passive element 202 may be positioned on the second side of the first passive element 201, and the semiconductor chip 300 may be positioned on the first side of the first passive element 201. In this case, the roughness of upper surfaces of a first sub-region R2a-1 and a second sub-region R2b-1 of a first passive element adjacent region R2 may be less than the roughness of upper surfaces of a third sub-region R2c and a fourth sub-region R2d of the first passive element adjacent region R2. For example, the roughness of upper surfaces of the first sub-region R2a-1 and the second sub-region R2b-1 of the first passive element adjacent region R2 may be less than the roughness of upper surfaces of the third sub-region R2c and the fourth sub-region R2d of the first passive element adjacent region R2 by 80 nm or more.

The roughness of upper surfaces of a fifth sub-region R2e-1 to an eighth sub-region R2h-1 of the first passive element adjacent region R2 may be less than the roughness of upper surfaces of a third sub-region R2c and a fourth sub-region R2d of the first passive element adjacent region R2. For example, the roughness of upper surfaces of the fifth sub-region R2e-1 to the eighth sub-region R2h-1 of the first passive element adjacent region R2 may be less than the roughness of upper surfaces of the third sub-region R2c and the fourth sub-region R2d of the first passive element adjacent region R2 by 80 nm or more.

By forming the first sub-region R2a-1, the fifth sub-region R2e-1, and the sixth sub-region R2f-1 of the first passive element adjacent region R2 relatively flat, the flow of the first flux layer 271 to the first side of the first passive element 201 may be reduced. Accordingly, the first flux layer 271 may be prevented from contaminating the bump pad 124a-1 (refer to FIG. 1A) under the semiconductor chip 300 positioned on the first side of the first passive element 201.

By forming the second sub-region R2b-1, the seventh sub-region R2g-1, and the eighth sub-region R2h-1 of the first passive element adjacent region R2 to be relatively flat, the flow of the first flux layer 271 to the second side of the first passive element 201 may be reduced. Accordingly, the first flux layer 271 may be prevented from meeting, e.g., contacting, the second flux layer 272. Therefore, an increase in the concentration of the flux mixed with the sealing portion may be prevented (see 400, FIG. 1A). Therefore, an increase in the concentration of the flux mixed with the sealing portion 400 (refer to FIG. 1A) may be prevented.

Figure 9:
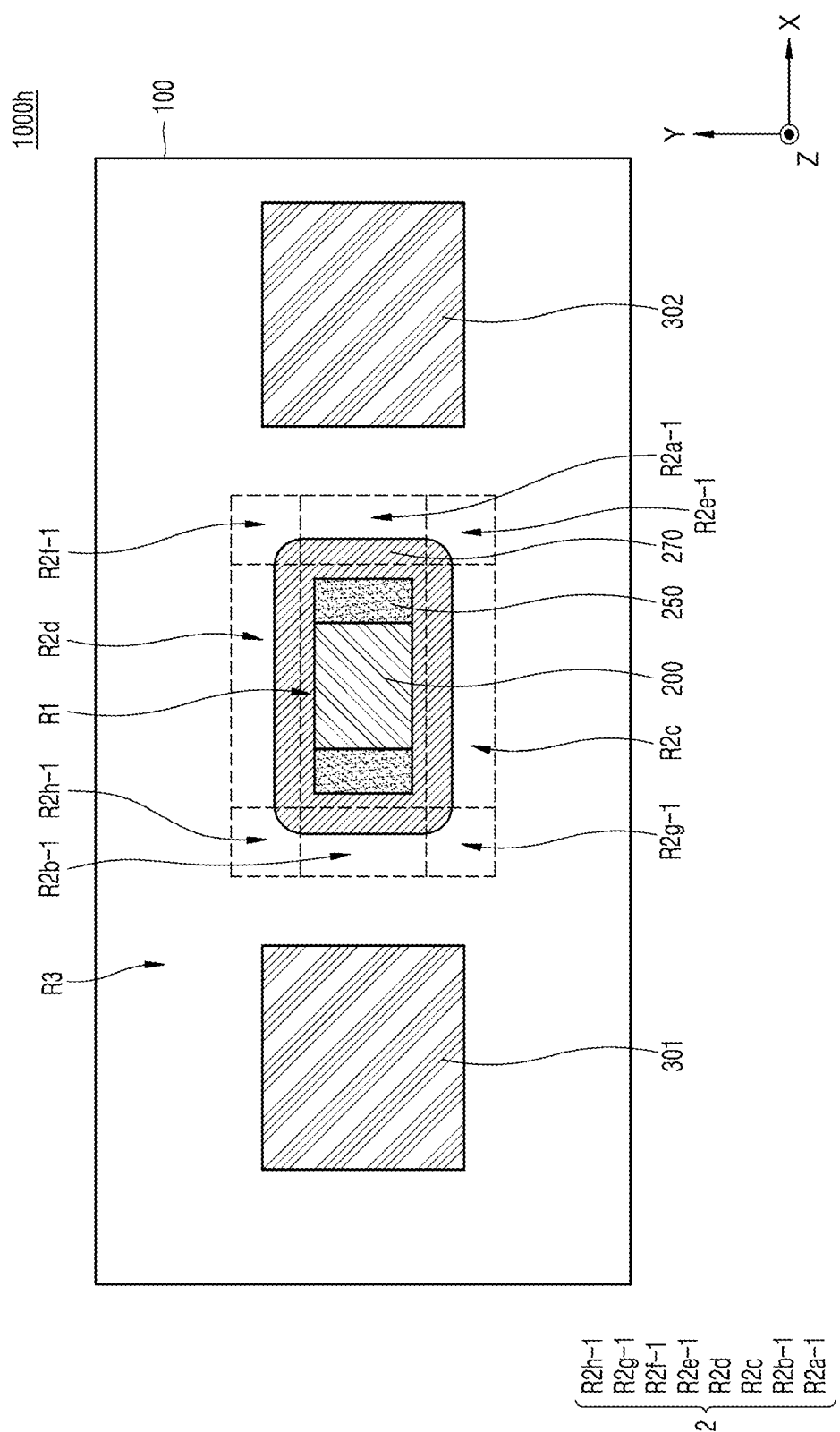
FIG. 9 is a plan view of a semiconductor package according to one embodiment.

FIG. 9 is a plan view showing a semiconductor package 1000h according to an embodiment. Hereinafter, differences between the semiconductor package 1000g shown in FIG. 8 and the semiconductor package 1000h shown in FIG. 9 are described.

Referring to FIG. 9, the semiconductor package 1000h may include the passive element 200, the first semiconductor chip 301, and the second semiconductor chip 302, instead of the first passive element 201, the second passive element 202, and the semiconductor chip 300. The first semiconductor chip 301 may be located on a second side of the passive element 200, and the second semiconductor chip 302 may be located on a first side of the passive element 200. In other words, the passive element 200 may be between the first and second semiconductor chips 301 and 302 along the X direction.

By forming a first sub-region R2a-1, a fifth sub-region R2e-1, and a sixth sub-region R2f-1 of a passive element adjacent region R2 relatively flat, the flow of the flux layer 270 to the first side of the passive element 200 may be reduced. Accordingly, the flux layer 270 may be prevented from contaminating the bump pad 124a-1 (refer to FIG. 1A) under the second semiconductor chip 302 positioned on the first side of the passive element 200.

By forming a second sub-region R2b-1, a seventh sub-region R2g-1, and an eighth sub-region R2h-1 of the passive element adjacent region R2 to be relatively flat, the flow of the flux layer 270 to the second side of the passive element 200 may be reduced. Accordingly, the flux layer 270 may be prevented from contaminating the bump pad 124a-1 (refer to FIG. 1A) under the first semiconductor chip 301 positioned on the second side of the passive element 200.

Figure 10:
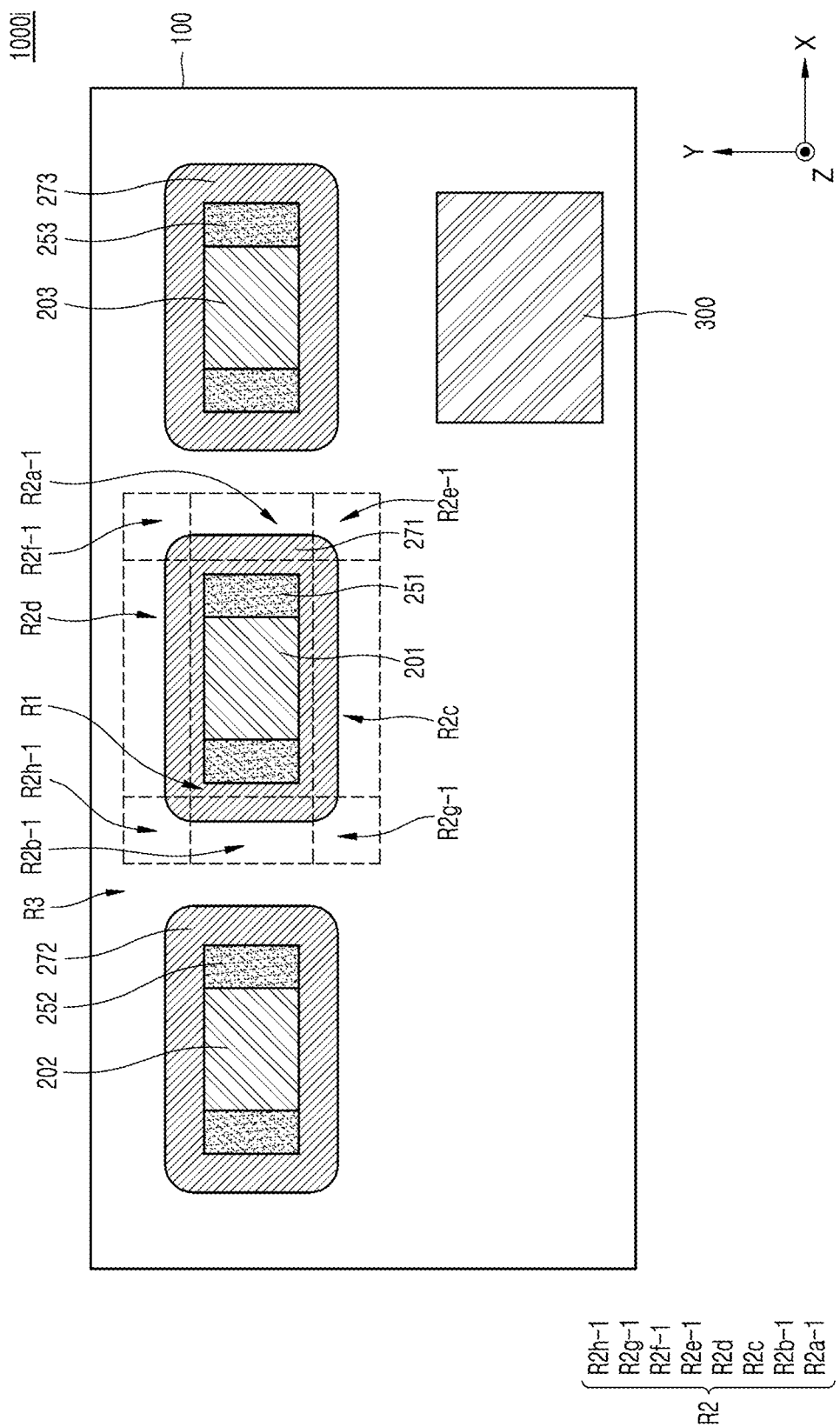
FIG. 10 is a plan view of a semiconductor package according to an embodiment.

FIG. 10 is a plan view showing a semiconductor package 1000i according to an embodiment. Hereinafter, differences between the semiconductor package 1000g shown in FIG. 8 and the semiconductor package 1000i shown in FIG. 10 are described.

Referring to FIG. 10, the semiconductor package 1000i may further include the third passive element 203 on the package substrate 100, the third passive element connecting member 253 connecting the third passive element 203 to the package substrate 100, and the third flux layer 273 adjacent to the third passive element 203 on the package substrate 100. The second passive element 202 may be positioned on the second side of the first passive element 201, and the third passive element 203 may be positioned on the first side of the first passive element 201.

By forming a first sub-region R2a-1, the fifth sub-region R2e-1, and a sixth sub-region R2f-1 of the first passive element adjacent region R2 relatively flat, the flow of the first flux layer 271 to the first side of the first passive element 201 may be reduced. Accordingly, the first flux layer 271 may be prevented from meeting, e.g., contacting, the third flux layer 273. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming a second sub-region R2b-1, a seventh sub-region R2g-1, and an eighth sub-region R2h-1 of the first passive element adjacent region R2 to be relatively flat, the flow of the first flux layer 271 to the second side of the first passive element 201 may be reduced. Accordingly, the first flux layer 271 may be prevented from meeting, e.g., contacting, the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 11:
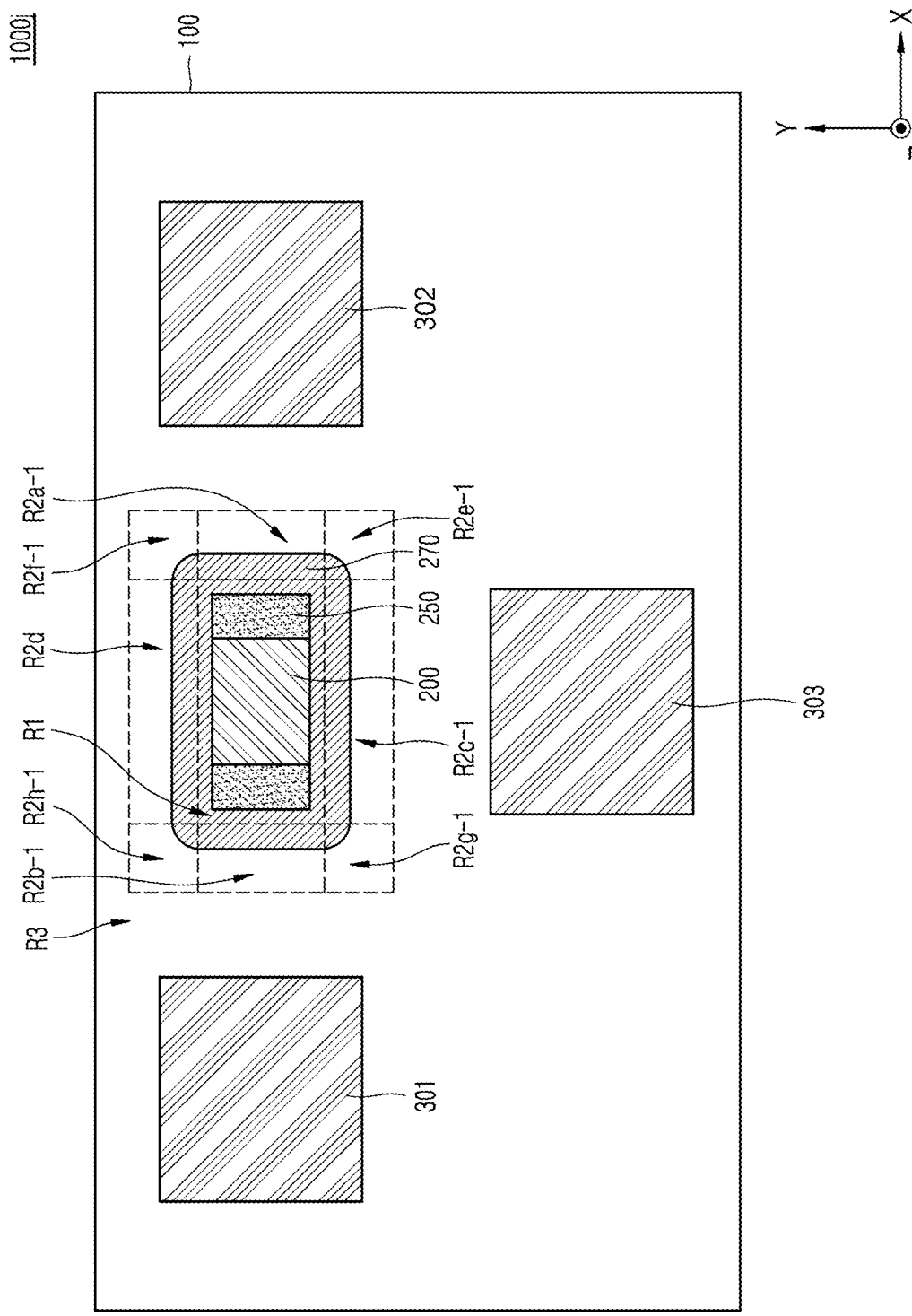
FIG. 11 is a plan view of a semiconductor package according to an embodiment.

FIG. 11 is a plan view showing a semiconductor package 1000j according to an embodiment. Hereinafter, differences between the semiconductor package 1000 shown in FIGS. 1A to 1C and the semiconductor package 1000j shown in FIG. 11 are described.

Referring to FIG. 11, the semiconductor package 1000j may include the first semiconductor chip 301, the second semiconductor chip 302, and a third semiconductor chip 303 (instead of the single semiconductor chip 300 in FIGS. 1A-1C). The first semiconductor chip 301 may be located on the second side of a passive element 200, the second semiconductor chip 302 may be located on the first side of the passive element 200, and the third semiconductor chip 303 may be located on the third side of the passive element 200.

In this case, the roughness of top surfaces of a first sub-region R2a-1 to a third sub-region R2c-1 of the passive element adjacent region R2 may be less than the roughness of the upper surface of a fourth sub-region R2d of the passive element adjacent region R2. For example, the roughness of upper surfaces of the first sub-region R2a-1 to the third sub-region R2c-1 of the passive element adjacent region R2 may be less than the roughness of the upper surface of the fourth sub-region R2d of the passive element adjacent region R2 by about 80 nm or more.

The roughness of the upper surfaces of a fifth sub-region R2e-1 to an eighth sub-region R2h-1 of the passive element adjacent region R2 may be less than the roughness of the upper surface of a fourth sub-region R2d of the passive element adjacent region R2. For example, the roughness of the upper surfaces of the fifth sub-region R2e-1 to the eighth sub-region R2h-1 of the passive element adjacent region R2 may be less than the roughness of the upper surface of the fourth sub-region R2d of the passive element adjacent region R2 by about 80 nm or more.

By forming the first sub-region R2a-1, the fifth sub-region R2e-1, and the sixth sub-region R2f-1 of the passive element adjacent region R2 relatively flat, the flow of the flux layer 270 to the first side of the passive element 200 may be reduced. Therefore, the flux layer 270 may be prevented from contaminating the bump pad 124a-1 (refer to FIG. 1A) under the second semiconductor chip 302 positioned on the first side of the passive element 200.

By forming the second sub-region R2b-1, the seventh sub-region R2g-1, and the eighth sub-region R2h-1 of the passive element adjacent region R2 to be relatively flat, the flow of the flux layer 270 to the second side of the passive element 200 may be reduced. Accordingly, the flux layer 270 may be prevented from contaminating the bump pad 124a-1 (refer to FIG. 1A) under the first semiconductor chip 301 positioned on the second side of the passive element 200.

By forming the third sub-region R2c-1, the fifth sub-region R2e-1, and the seventh sub-region R2g-1 of the passive element adjacent region R2 to be relatively flat, the flow of the flux layer 270 to the third side of the passive element 200 may be reduced. Accordingly, the flux layer 270 may be prevented from contaminating the bump pad 124a-1 (refer to FIG. 1A) under the third semiconductor chip 303 positioned on the third side of the passive element 200.

Figure 12:
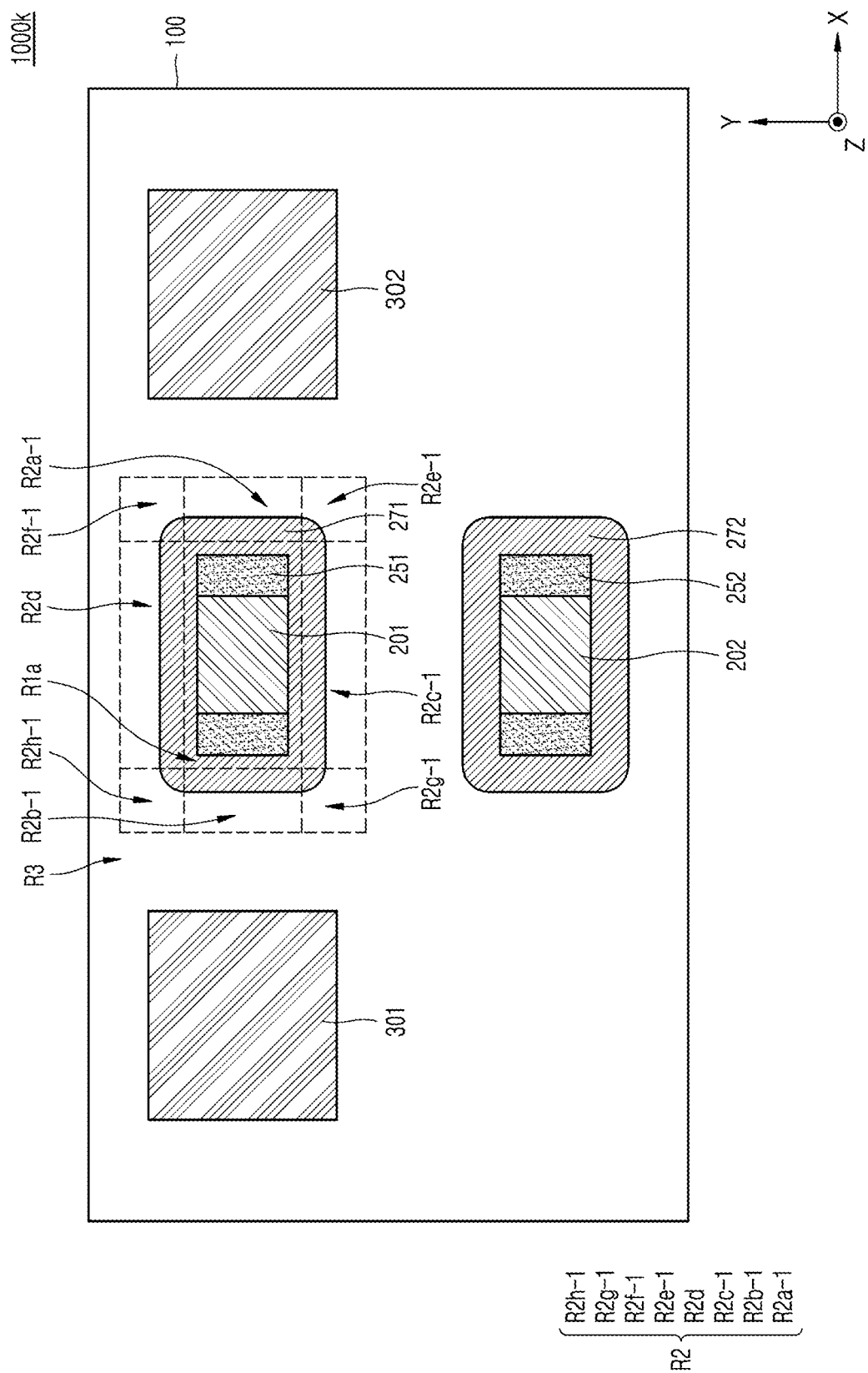
FIG. 12 is a plan view of a semiconductor package according to an embodiment.

FIG. 12 is a plan view showing a semiconductor package 1000k according to an embodiment. Hereinafter, differences between the semiconductor package 1000j shown in FIG. 11 and the semiconductor package 1000k shown in FIG. 12 are described.

Referring to FIG. 12, the semiconductor package 1000k may include the first passive element 201 and the second passive element 202 on the package substrate 100 (instead of the single passive element 200 and the third semiconductor chip 303 in FIG. 11). The semiconductor package 1000k may further include the second passive element connecting member 252 that connects the second passive element 202 to the package substrate 100 and the second flux layer 272 adjacent the second passive element 202 on the package substrate 100.

By forming a first sub-region R2a-1, a fifth sub-region R2e-1, and a sixth sub-region R2f-1 of a first passive element adjacent region R2 relatively flat, the flow of a first flux layer 271 to a first side of the first passive element 201 may be reduced. Accordingly, the first flux layer 271 may be prevented from contaminating the bump pads 124a-1 (refer to FIG. 1A) under the second semiconductor chip 302 positioned on the first side of the first passive element 201.

By forming a second sub-region R2b-1, a seventh sub-region R2g-1, and an eighth sub-region R2h-1 of the first passive element adjacent region R2 to be relatively flat, the flow of the first flux layer 271 to a second side of the first passive element 201 may be reduced. Accordingly, the first flux layer 271 may be prevented from contaminating the bump pad 124a-1 (refer to FIG. 1A) under the first semiconductor chip 301 positioned on the second side of the first passive element 201.

By forming a third sub-region R2c-1, the fifth sub-region R2e-1, and a seventh sub-region R2g-1 of the first passive element adjacent region R2 to be relatively flat, the flow of the first flux layer 271 to the third side of the first passive element 201 may be reduced. Accordingly, the first flux layer 271 may be prevented from meeting the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 13:
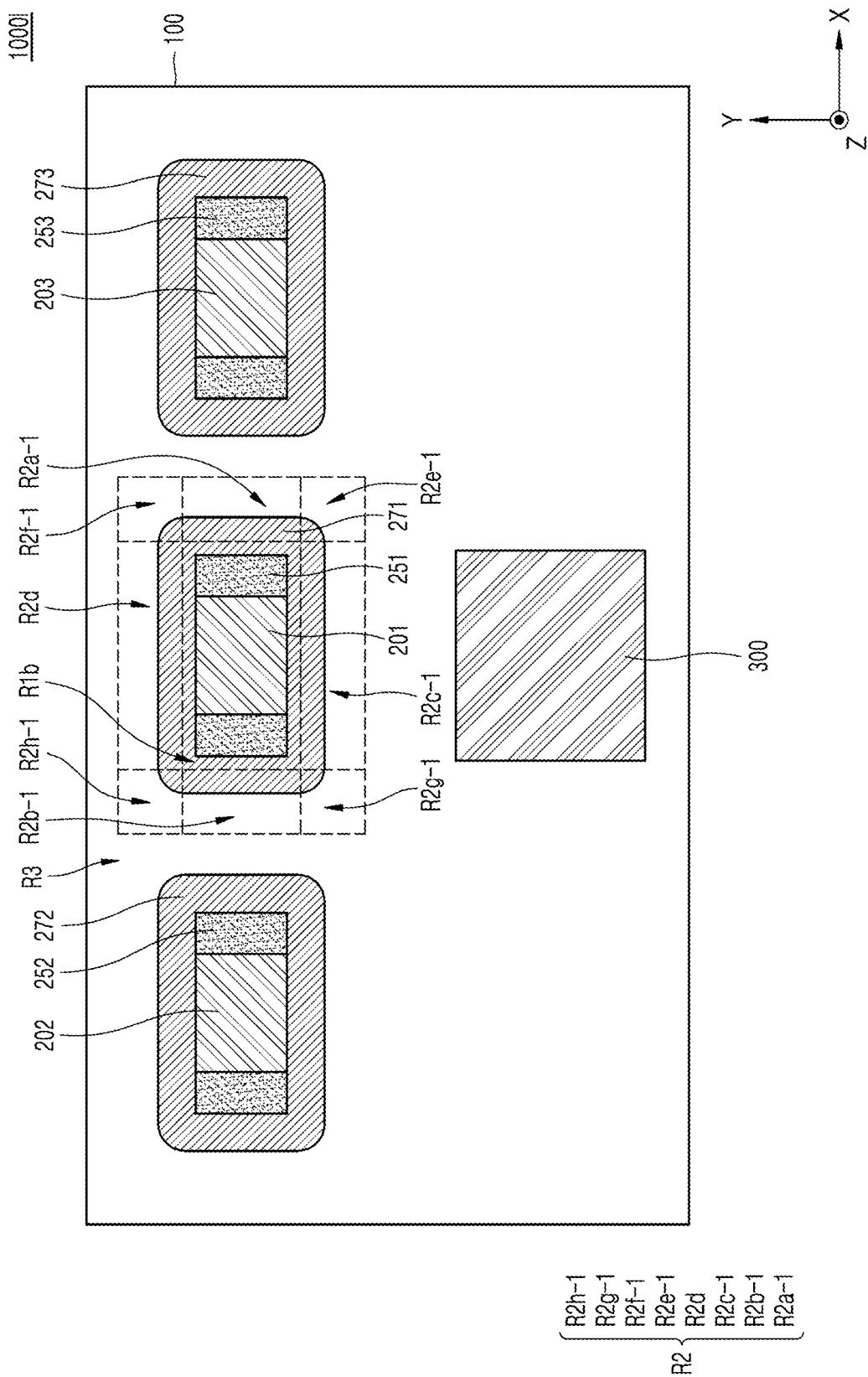
FIG. 13 is a plan view of a semiconductor package according to an embodiment.

FIG. 13 is a plan view showing a semiconductor package 10001 according to an embodiment. Hereinafter, differences between the semiconductor package 1000k shown in FIG. 12 and the semiconductor package 10001 shown in FIG. 13 are described.

Referring to FIG. 13, the semiconductor package 10001 may include the third passive element 203 and a single semiconductor chip 300 (instead of the first semiconductor chip 301 and the second semiconductor chip 302 in FIG. 12). The semiconductor package 10001 may further include the third passive element connecting member 253 connecting the third passive element 203 to the package substrate 100 and the third flux layer 273 adjacent to the third passive element 203 on the package substrate 100. The second passive element 202 may be located on the second side of the first passive element 201, the third passive element 203 may be located on the first side of the first passive element 201, and the semiconductor chip 300 may be located on a third side of the first passive element 201.

By forming a first sub-region R2a-1, a fifth sub-region R2e-1, and a sixth sub-region R2f-1 of the first passive element adjacent region R2 relatively flat, the flow of the first flux layer 271 to the first side of the first passive element 201 may be reduced. Accordingly, the first flux layer 271 may be prevented from meeting the third flux layer 273. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming a second sub-region R2b-1, a seventh sub-region R2g-1, and an eighth sub-region R2h-1 of the first passive element adjacent region R2 to be relatively flat, the flow of the first flux layer 271 to the second side of the first passive element 201 may be reduced. Accordingly, the first flux layer 271 may be prevented from meeting the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming a third sub-region R2c-1, a fifth sub-region R2e-1, and a seventh sub-region R2g-1 of the first passive element adjacent region R2 to be relatively flat, the flow of the first flux layer 271 to the third side of the first passive element 201 may be reduced. Accordingly, the first flux layer 271 may be prevented from contaminating the bump pad 124a-1 (refer to FIG. 1A) under the semiconductor chip 300 positioned on the third side of the first passive element 201.

Figure 14:
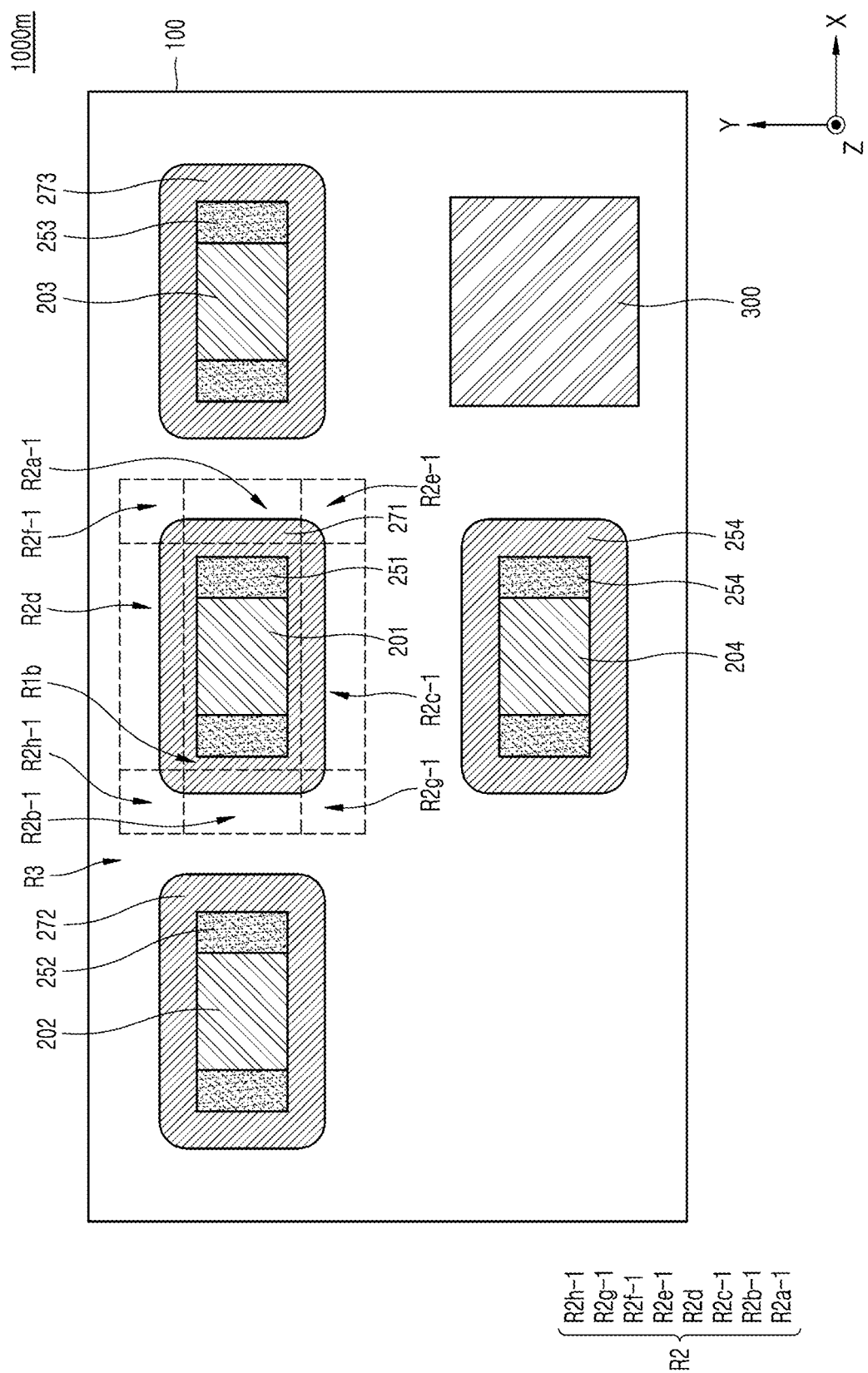
FIG. 14 is a plan view of a semiconductor package according to an embodiment.

FIG. 14 is a plan view showing a semiconductor package 1000m according to an embodiment. Hereinafter, differences between the semiconductor package 10001 shown in FIG. 13 and the semiconductor package 1000m shown in FIG. 14 are described.

Referring to FIG. 14, the semiconductor package 1000m may further include a fourth passive element 204 on the package substrate 100, a fourth passive element connecting member 254 connecting the fourth passive element 204 to the package substrate 100, and a fourth flux layer 274 adjacent to the fourth passive element 204 on the package substrate 100. The second passive element 202 may be located on the second side of the first passive element 201, the third passive element 203 may be located on the first side of the first passive element 201, and the fourth passive element 204 may be located on the third side of the second passive element 202.

By forming a first sub-region R2a-1, a fifth sub-region R2e-1, and a sixth sub-region R2f-1 of the first passive element adjacent region R2 relatively flat, the flow of the first flux layer 271 to the first side of the first passive element 201 may be reduced. Accordingly, the first flux layer 271 may be prevented from meeting the third flux layer 273. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming a second sub-region R2b-1, a seventh sub-region R2g-1, and an eighth sub-region R2h-1 of the first passive element adjacent region R2 to be relatively flat, the flow of the first flux layer 271 to the second side of the first passive element 201 may be reduced. Accordingly, the first flux layer 271 may be prevented from meeting the second flux layer 272. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

By forming a third sub-region R2c-1, a fifth sub-region R2e-1, and a seventh sub-region R2g-1 of the first passive element adjacent region R2 to be relatively flat, the flow of the first flux layer 271 to a third side of the first passive element 201 may be reduced. Accordingly, the first flux layer 271 may be prevented from meeting the fourth flux layer 274. Therefore, an increase in the concentration of the flux mixed with the sealing portion 400 (refer to FIG. 1A) may be prevented. Accordingly, it is possible to prevent delamination between the sealing portion 400 (refer to FIG. 1A) and the package substrate 100.

Figure 15:
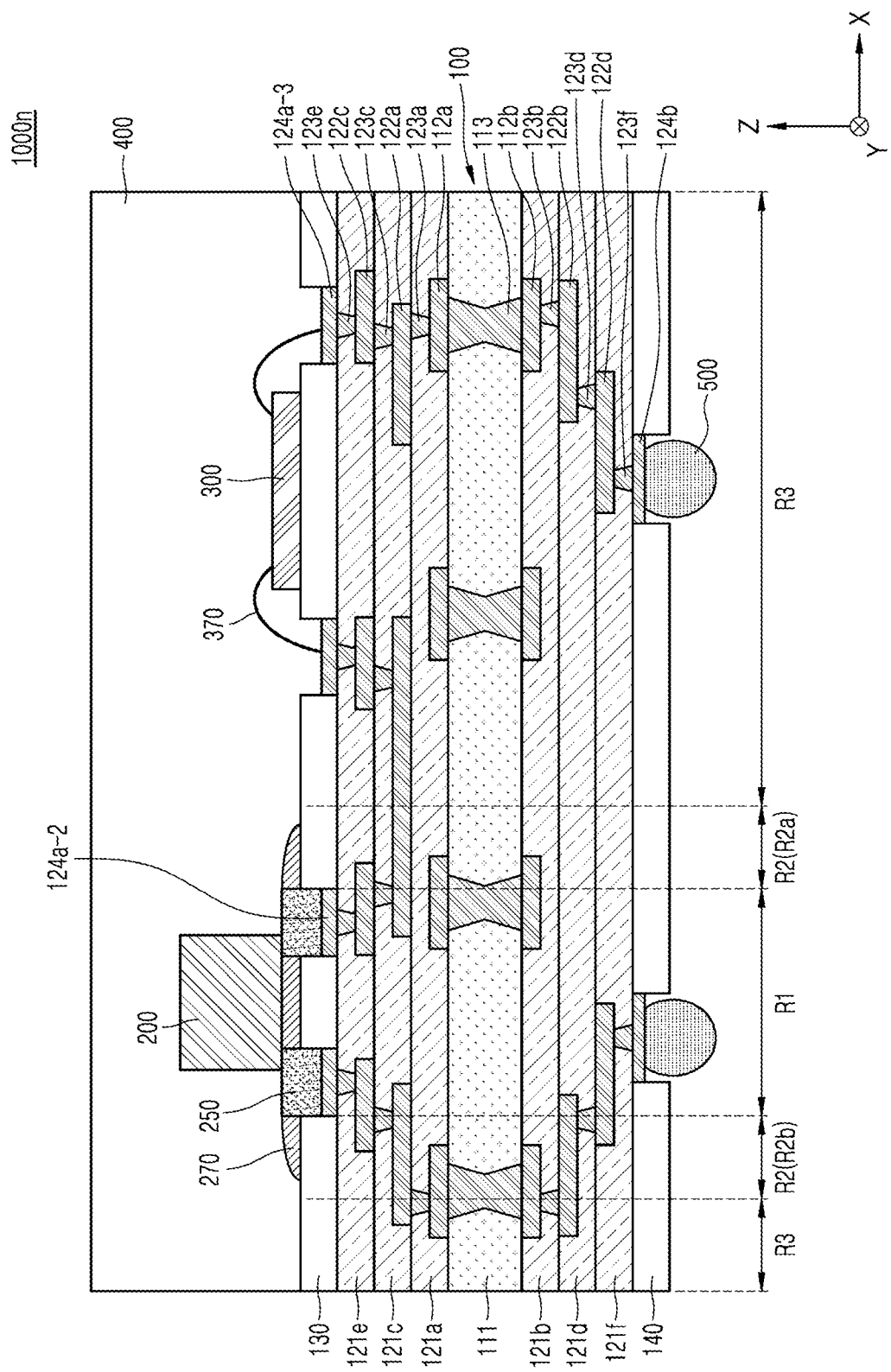
FIG. 15 is a cross-sectional view of a semiconductor package according to an embodiment.

FIG. 15 is a cross-sectional view illustrating a semiconductor package 1000n according to an embodiment. Hereinafter, differences between the semiconductor packages 1000 shown in FIGS. 1A to 1C and the semiconductor package 1000n shown in FIG. 15 are described.

Referring to FIG. 15, the semiconductor package 1000n may include a wire 370 instead of the chip bump 350. Also, the package substrate 100 may include a wire pad 124a-3 instead of the bump pad 124a-1. The wire 370 may connect the semiconductor chip 300 to the wire pad 124a-3 of the package substrate 100.

By forming the remaining region R3 to be relatively flat, the flow of a flux layer 270 onto the remaining region R3 may be reduced. Accordingly, the flux layer 270 may be prevented from contaminating the wire pads 124a-3.

Figure 16:
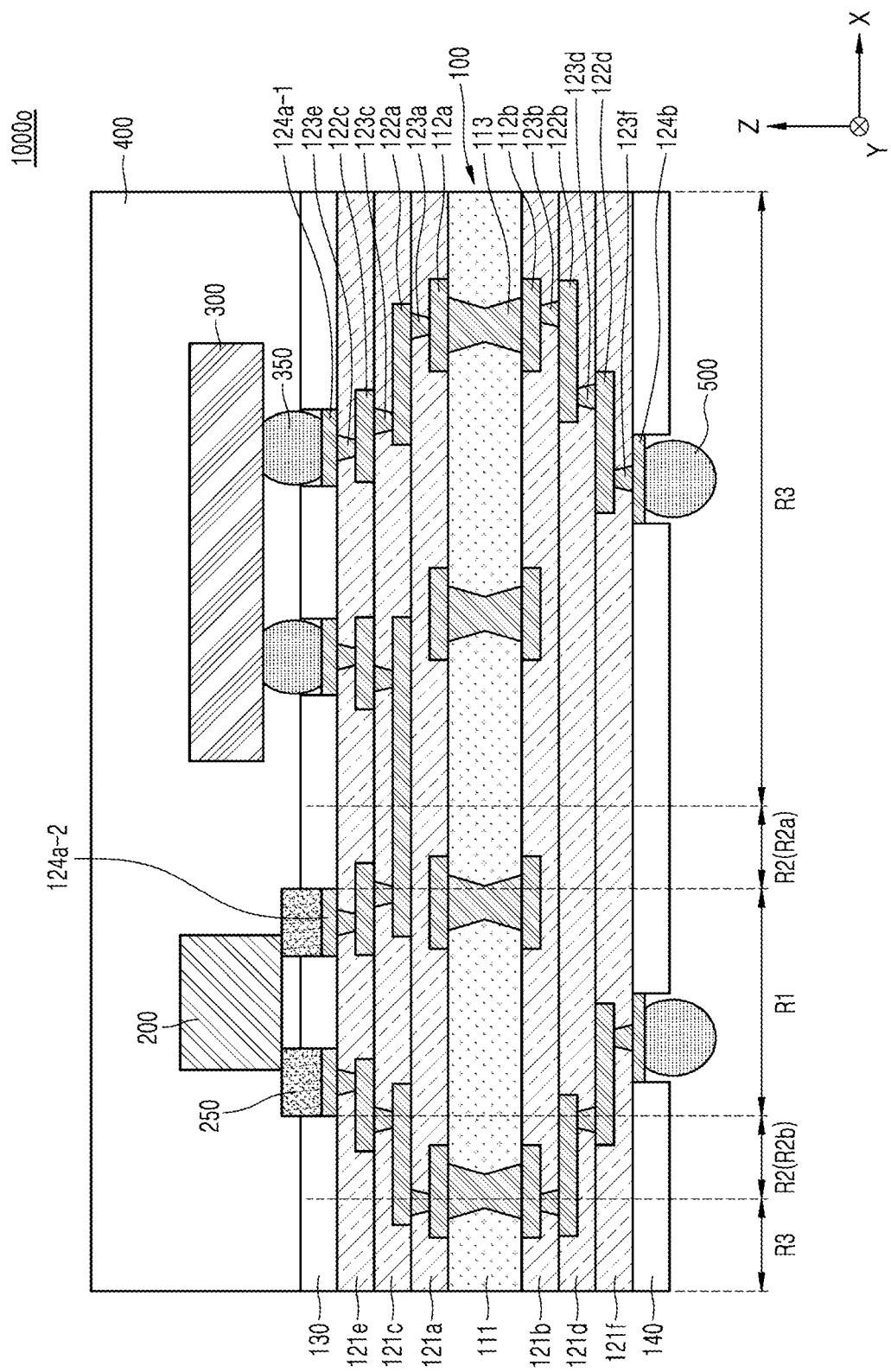
FIG. 16 is a cross-sectional view of a semiconductor package according to an embodiment.

FIG. 16 is a cross-sectional view illustrating a semiconductor package 10000 according to an embodiment; Hereinafter, differences between the semiconductor package 1000k shown in FIGS. 1A to 12 and the semiconductor package 10000 shown in FIG. 16 are described.

Referring to FIG. 16, the flux layer 270 may not be present on the passive element region R1 and the passive element adjacent region R2. For example, after the passive element 200 is mounted on the package substrate 100, the flux layer 270 may be removed. For example, when the flux layer 270 includes an aqueous flux, the flux layer 270 may be removed using water.

Figure 17:
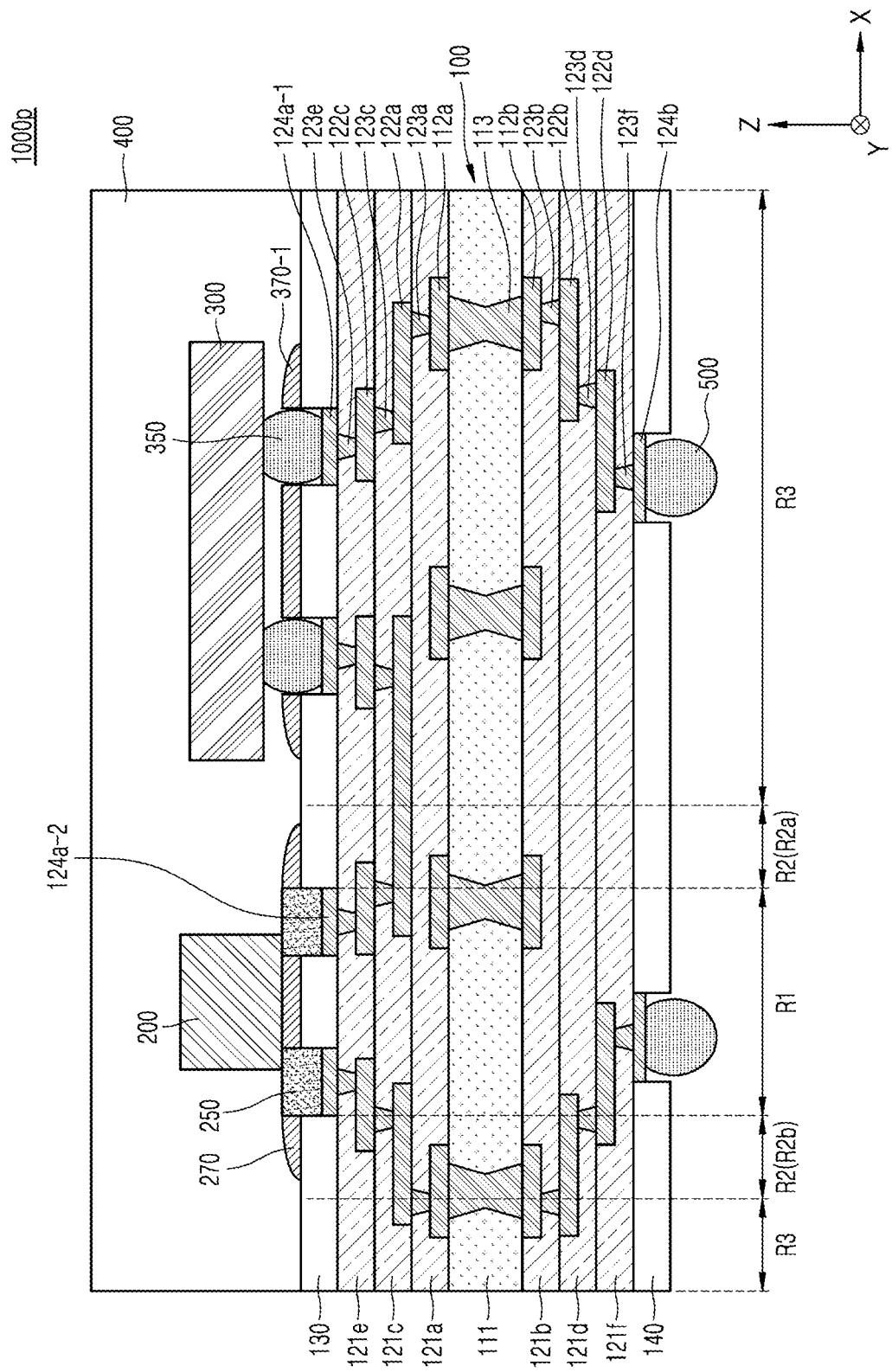
FIG. 17 is a cross-sectional view of a semiconductor package according to an embodiment.

FIG. 17 is a cross-sectional view illustrating a semiconductor package 1000p according to an embodiment. Hereinafter, differences between the semiconductor package 1000 shown in FIGS. 1A to 1C and the semiconductor package 1000p shown in FIG. 17 are described.

Referring to FIG. 17, the semiconductor package 1000p may further include a chip flux layer 370-1. When the semiconductor chip 300 is mounted on the package substrate 100, the chip flux layer 370-1 around the chip bump 350 is generally used. After the semiconductor chip 300 is mounted on the package substrate 100, the chip flux layer 370-1 may be removed. For example, when the chip flux layer 370-1 includes an aqueous flux, the chip flux layer 370-1 may be removed using water. However, in another embodiment, as shown in FIG. 17, the chip plus layer 370-1 may remain without being removed.

Figure 18:
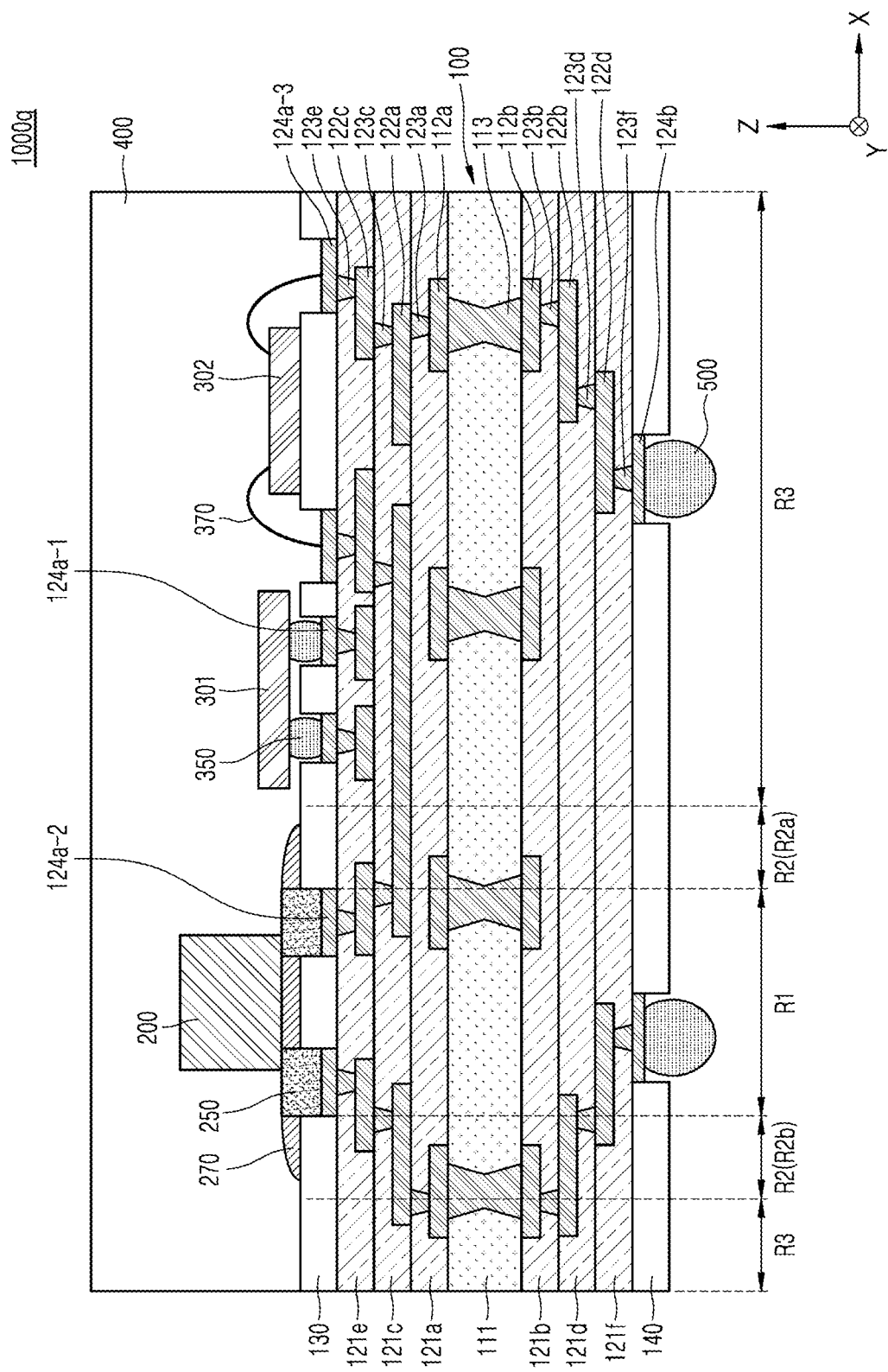
FIG. 18 is a cross-sectional view of a semiconductor package according to an embodiment.

FIG. 18 is a cross-sectional view illustrating a semiconductor package 1000q according to an embodiment. Hereinafter, differences between the semiconductor package 1000 shown in FIGS. 1A to 1C and the semiconductor package 1000q shown in FIG. 18 are described.

Referring to FIG. 18, the semiconductor package 1000q may include the first semiconductor chip 301 and the second semiconductor chip 302 on the package substrate 100 instead of the semiconductor chip 300. In some embodiments, the first semiconductor chip 301 may be a memory controller chip, and the second semiconductor chip 302 may be a memory chip, e.g., a flash memory chip. The first semiconductor chip 301 may be connected to the bump pads 124a-1 of the package substrate 100 using the chip bumps 350. The package substrate 100 may further include the wire pads 124a-3 on the fifth insulating layer 121e. The semiconductor package 1000q may further include the wire 370 connecting the second semiconductor chip 302 to the wire pad 124a-3 of the package substrate 100.

Although FIG. 18 illustrates that the semiconductor package 1000q includes two semiconductor chips, e.g., the first semiconductor chip 301 and the second semiconductor chip 302, the number of semiconductor chips included in the semiconductor package 1000q is not limited to two. For example, the semiconductor package 1000q may include a plurality of second semiconductor chips 302. The plurality of second semiconductor chips 302 may be a plurality of flash memory chips. The plurality of second semiconductor chips 302 may be stacked on the package substrate 100. Additionally, or alternatively, the semiconductor package 1000q may further include a third semiconductor chip, e.g., a DRAM chip, located on, e.g., the package substrate 100, the first semiconductor chip 301, or the second semiconductor chip 302.

By forming the first semiconductor chip 301 and the second semiconductor chip 302 on the remaining region R3 having a relatively flat upper surface, the flux layer 270 may be prevented from contaminating the bump pad 124a-1 and the wire pad 124a-3. Further, a flux layer used to mount the first semiconductor chip 301 on the package substrate 100 may be prevented from contaminating the wire pads 124a-3.

Figure 19:
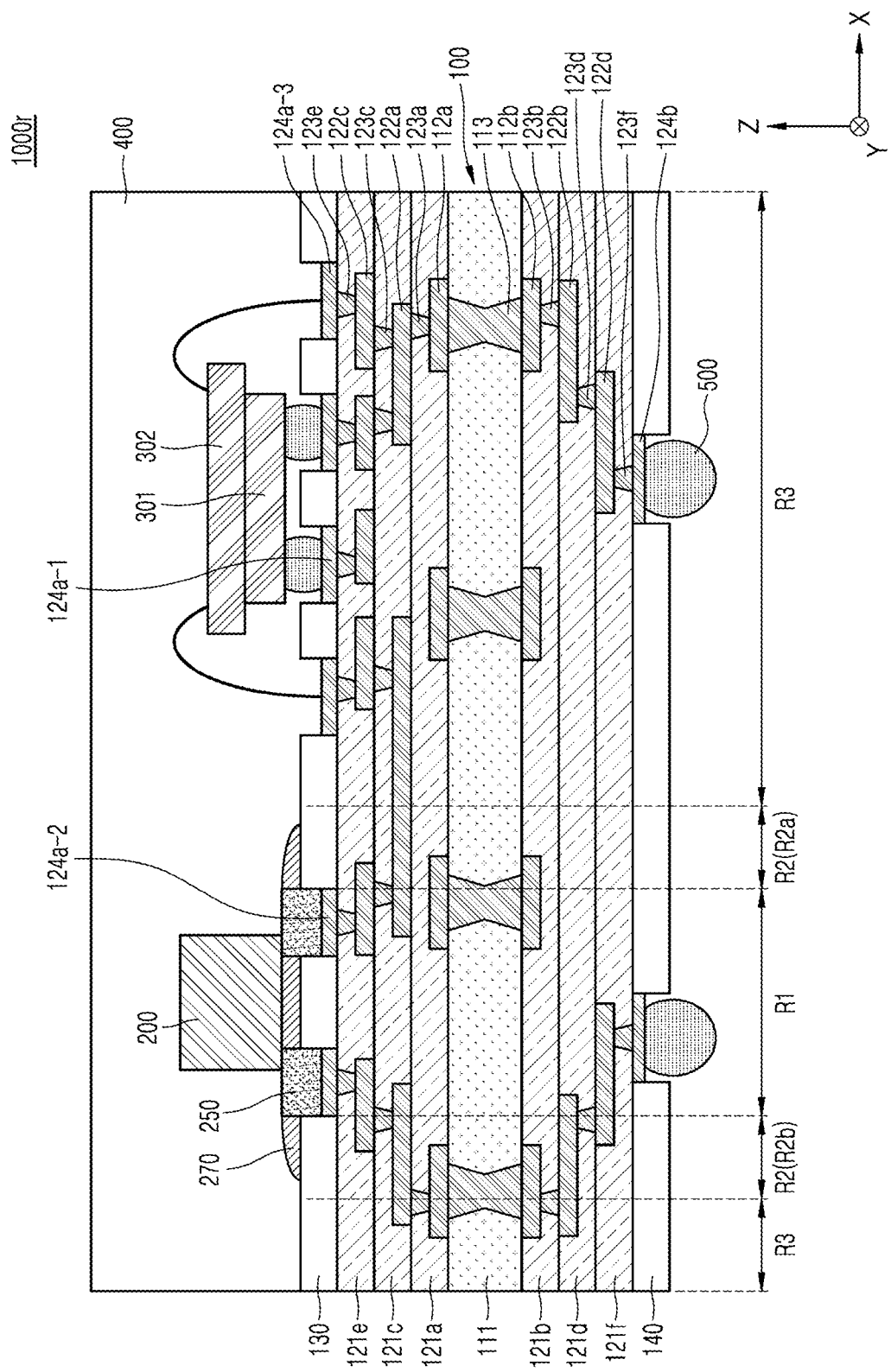
FIG. 19 is a cross-sectional view of a semiconductor package according to an embodiment.

FIG. 19 is a cross-sectional view illustrating a semiconductor package 1000r according to an embodiment. Hereinafter, differences between the semiconductor package 1000q shown in FIG. 18 and the semiconductor package 1000r shown in FIG. 19 are described.

Referring to FIG. 19, the second semiconductor chip 302 may be stacked on the first semiconductor chip 301. Although FIG. 19 illustrates that the semiconductor package 1000r includes two semiconductor chips, e.g., the first semiconductor chip 301 and the second semiconductor chip 302, the number of semiconductor chips included in the semiconductor package 1000r is not limited to two. For example, the semiconductor package 1000r may include a plurality of second semiconductor chips 302. The plurality of second semiconductor chips 302 may be a plurality of flash memory chips. The plurality of second semiconductor chips 302 may be stacked on the first semiconductor chip 301. Additionally, or alternatively, the semiconductor package 1000q may further include a third semiconductor chip, e.g., a DRAM chip, positioned between the first semiconductor chip 301 and the second semiconductor chip 302 or on the second semiconductor chip 302.

Figure 20A:
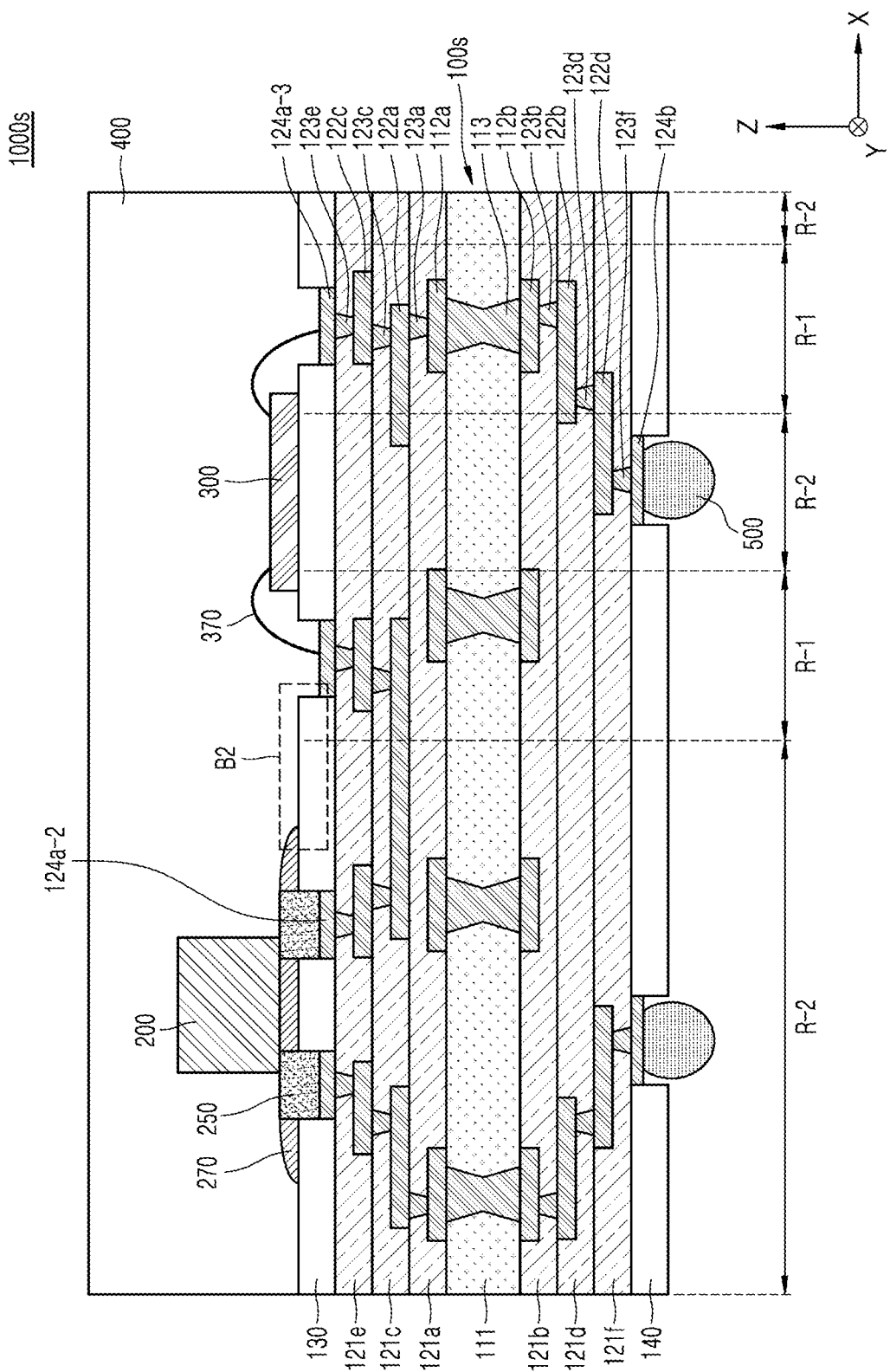
FIG. 20A is a cross-sectional view of a semiconductor package according to an embodiment.
Figure 20B:
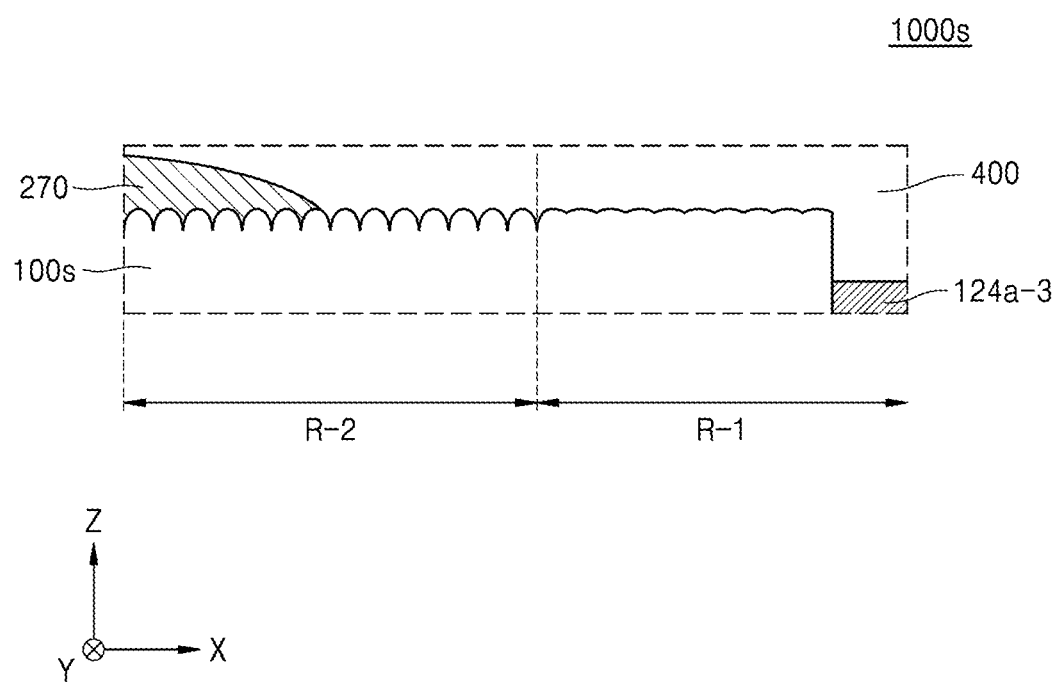
FIG. 20B is an enlarged view of region B2 in FIG. 20A.

FIG. 20A is a cross-sectional view illustrating a semiconductor package 1000s according to an embodiment. FIG. 20B is an enlarged view of region B2 of FIG. 20A. Hereinafter, differences between the semiconductor package 1000n shown in FIG. 15 and the semiconductor package 1000s shown in FIGS. 20A and 20B are described.

Referring to FIGS. 20A and 20B, the semiconductor package 1000s may include a wire pad adjacent region R-1 adjacent to the wire pad 124a-3 and a remaining region R-2. The semiconductor chip 300 may be located on the remaining region R-2. The roughness of the upper surface of the wire pad adjacent region R-1 may be less than the roughness of the upper surface of the remaining region R-2. Accordingly, the flux layer 270 may be prevented from flowing into the wire pad adjacent region R-1 and contaminating the wire pad 124a-3.

Figure 21:
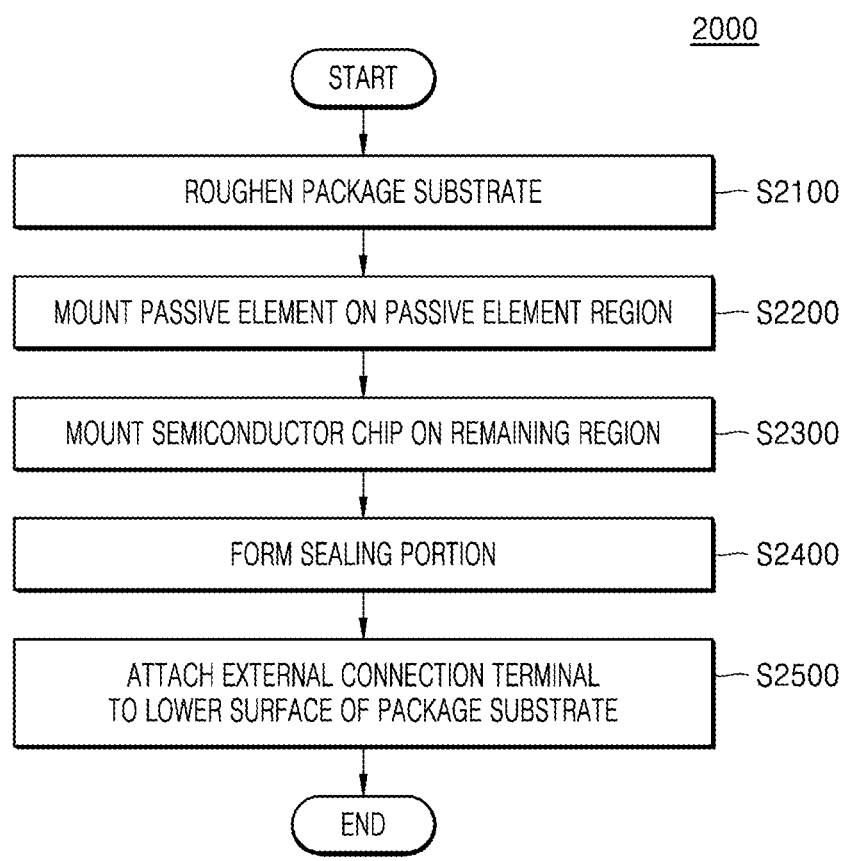
FIG. 21 is a flowchart of a method of manufacturing a semiconductor package, according to an embodiment.

FIG. 21 is a flowchart illustrating a method 2000 of manufacturing a semiconductor package according to an embodiment.

Referring to FIGS. 21 and 1A to 1C, the package substrate 100 may be roughened in operation S2100. Through the operation S2100, the roughness of the upper surface of at least one of the first sub-regions R2a to R2d may be greater than the roughness of the upper surface of a remaining region R3.

For example, a mask may be arranged on a region of the package substrate 100 that should be relatively flat, and the region of the package substrate 100 that should be relatively rough may be etched. For etching, dry etching, wet etching, or a combination thereof may be used. For example, plasma etching may be used. For example, a mask may be arranged on the remaining region R3, and the passive element region R1 and the passive element adjacent region R2 may be etched. The etched passive element region R1 and passive element adjacent region R2 may be relatively rough, and a non-etched remaining region R3 may be relatively flat. Alternatively, a mask may be arranged on the remaining region R3 and the passive element region R1, and the passive element adjacent region R2 may be etched. As shown in FIG. 2, the etched passive adjacent region R2 may be relatively rough, and the non-etched remaining region R3 and passive element region R1 may be relatively flat. Alternatively, referring to FIGS. 20A and 20B, a mask may be arranged on the wire pad adjacent region R-1, and the remaining region R-2 may be etched. The etched remaining region R-2 may be relatively rough, and a non-etched wire pad adjacent region R-1 may be relatively flat.

Additionally, a mask may be arranged on a region of the package substrate 100 that should be relatively rough, and the region of the package substrate 100 that should be relatively flat may be further etched. However, by adjusting the etching conditions, e.g., time, concentration, power, flow rate, pressure, temperature, etc., the etching may be performed weaker than the first etching. For example, a mask may be arranged on the passive element region R1 and the passive element region R2, and the remaining region R3 may be lightly etched. Alternatively, a mask may be arranged on the passive element region R2, and the passive element region R1 and the remaining region R3 may be lightly etched. Alternatively, a mask may be arranged on the remaining region R-2, and the wire pad adjacent region R-1 may be lightly etched.

Next, the passive element 200 may be mounted on the passive element region R1 of the package substrate 100 in operation S2200. A solder paste may be used to mount the passive element 200 on the passive element region R1 of the package substrate 100. The passive element connecting member 250 and the flux layer 270 may be formed of the solder paste. The flux layer 270 may not be removed as shown in FIG. 1A or may be removed as shown in FIG. 16.

Next, the semiconductor chip 300 is mounted on the remaining region R3 of the package substrate 100 in operation S2300. Solder balls and flux may be used to mount the semiconductor chip 300 on the remaining region R3 of the package substrate 100. The chip bump 350 may be formed of the solder ball. The flux may be removed as shown in FIG. 1A, or may not be removed as shown in FIG. 17. As shown in FIG. 15, alternatively, the semiconductor chip 300 may be connected to the remaining region R3 of the package substrate 100 using the wire 370.

Next, the sealing portion 400 covering the package substrate 100, the passive element 200, and the semiconductor chip 300 may be formed in operation S2400. Finally, the external connection terminal 500 may be attached by attaching a solder ball to the lower surface of the package substrate 100 in operation S2500.

By way of summation and review, when a flux layer on a package substrate is mixed with a sealing portion, delamination may occur between the package substrate and the sealing portion. In addition, the flux layer may contaminate a bump pad of the package substrate and a chip bump or a wire pad of the package substrate.

In contrast, embodiments provide a semiconductor package for preventing delamination between a package substrate and a sealing portion and preventing contamination of a bump pad or a wire pad by a flux layer. That is, the roughness of the upper surface of the region adjacent to the passive element may be greater than the roughness of the upper surface of the remaining regions, thereby allowing the flux layer to spread more widely over the relatively rough surface. Accordingly, the concentration of the flux layer mixed in the sealing portion can be reduced and delamination between the package substrate and the sealing portion may be minimized. Also, because the upper surface of the remaining region is relatively flat, it may be difficult for the flux layer to flow into the remaining region, thereby preventing the flux layer from contaminating the bump pad or the wire pad.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a package substrate including a passive element region, a peripheral region adjacent to the passive element region, and a remaining region;
a first passive element on a non-conductive upper surface of the package substrate in the passive element region;
a passive element connecting member connecting the first passive element to the package substrate;
a first semiconductor chip on a non-conductive upper surface of the package substrate in the remaining region; and
a sealing portion covering the package substrate, the first passive element, and the first semiconductor chip,
wherein the peripheral region includes a first sub-region on a first side of the first passive element, a second sub-region on a second side opposite the first side of the first passive element, a third sub-region on a third side of the first passive element, and a fourth sub-region on a fourth side opposite the third side of the first passive element,
wherein a roughness of a non-conductive upper surface of the package substrate in at least one of the first sub-region to the fourth sub-region is greater than a roughness of the non-conductive upper surface of the package substrate in the remaining region, and
wherein the first semiconductor chip overlaps the remaining region in a plan view.

2. The semiconductor package as claimed in claim 1, wherein the roughness of the non-conductive upper surface of the package substrate in the passive element region is greater than the roughness of the non-conductive upper surface of the package substrate in the remaining region.

3. The semiconductor package as claimed in claim 1, wherein the roughness of the non-conductive upper surface of the package substrate in the passive element region is less than the roughness of the non conductive upper surface of the package substrate in the at least one of the first sub-region to the fourth sub-region.

4. The semiconductor package as claimed in claim 1, wherein the roughness of the non-conductive upper surface of the package substrate in the first sub-region is less than the roughness of the non-conductive upper surface of the package substrate in each of the second sub-region to the fourth sub-region.

5. The semiconductor package as claimed in claim 4, wherein the first semiconductor chip is positioned on the first side of the first passive element.

6. The semiconductor package as claimed in claim 4, further comprising a second passive element positioned on the first side of the first passive element.

7. The semiconductor package as claimed in claim 1, wherein the roughness of the non-conductive upper surface of the package substrate in each of the first sub-region and the third sub-region is less than the roughness of the non-conductive upper surface of the package substrate in each of the second sub-region and the fourth sub-region.

8. The semiconductor package as claimed in claim 7, wherein:
the first semiconductor chip is positioned on one of the first side and the third side of the first passive element, and
a second passive element or a second semiconductor chip is positioned on the other of the first side and the third side of the first passive element.

9. The semiconductor package as claimed in claim 7, further comprising a second passive element and a third passive element respectively positioned on the first side and the third side of the first passive element.

10. The semiconductor package as claimed in claim 1, wherein the roughness of the non-conductive upper surface of the package substrate in each of the first sub-region and the second sub-region is less than the roughness of the non-conductive upper surface of the package substrate in each of the third sub-region and the fourth sub-region.

11. The semiconductor package as claimed in claim 10, wherein:
the first semiconductor chip is positioned on one of the first side and the second side of the first passive element, and
a second passive element or a second semiconductor chip is positioned on the other one of the first side and the second side of the first passive element.

12. The semiconductor package as claimed in claim 1, wherein the roughness of the non-conductive upper surface of the package substrate in each of the first sub-region, the second sub-region, and the third sub-region is less than the roughness of the non-conductive upper surface of the package substrate in the fourth sub-region.

13. The semiconductor package as claimed in claim 12, wherein the first semiconductor chip is on one of the first side, the second side, and the third side of the first passive element.

14. The semiconductor package as claimed in claim 13, further comprising:
a second semiconductor chip and a third semiconductor chip respectively positioned on the other two sides of the first side, the second side, and the third side of the first passive element,
a second semiconductor chip and a second passive element respectively positioned on the other two sides of the first side, the second side, and the third side of the first passive element, or
a second passive element and a third passive element respectively positioned on the other two sides of the first side, the second side, and the third side of the first passive element.

15. The semiconductor package as claimed in claim 1, wherein the passive element connecting member is disposed in a recess in the package substrate and contacts sidewalls of the recess.

16. The semiconductor package as claimed in claim 1, further comprising a flux layer disposed on the non-conductive upper surface of the package substrate in at least the second sub-region of the peripheral region and contacting a side surface of the passive element connecting member.

17. A semiconductor package, comprising:
a package substrate including a wire pad, a peripheral region adjacent to the wire pad, and a remaining region;
a passive element on a non-conductive upper surface of the package substrate in the remaining region;
a passive element connecting member connecting the passive element to the package substrate;
a semiconductor chip on the non-conductive upper surface of the package substrate in the remaining region;
a wire electrically connecting the semiconductor chip to the wire pad; and
a sealing portion covering the package substrate, the passive element, the semiconductor chip, and the wire, and contacting a top horizontal surface of the passive element connecting member,
wherein a roughness of a non-conductive upper surface of the package substrate in the peripheral region is less than a roughness of the non-conductive upper surface of the substrate in the remaining region, and wherein the semiconductor chip overlaps the remaining region in a plan view.

18. A semiconductor package, comprising:
a package substrate including a passive element region, a peripheral region adjacent to the passive element region, and a remaining region;
a plurality of external connection terminals on a lower surface of the package substrate;
a passive element on a non-conductive upper surface of the package substrate in the passive element region;
a passive element connecting member connecting the passive element to the package substrate,
a memory controller chip on a non-conductive upper surface of the package substrate in the remaining region;
a chip bump connecting the memory controller chip to the package substrate;
a memory chip on the memory controller chip or the remaining region;
a wire connecting the memory chip to the package substrate;
a sealing portion covering the package substrate, the passive element, the memory controller chip, the chip bump, the memory chip, and the wire; and
a flux layer disposed between the package substrate a ad the passive element, the flux layer contacting a side surface of the passive element connecting member,
wherein the peripheral region includes a first sub-region on a first side of the passive element, a second sub-region on a second side opposite the first side of the passive element, a third sub-region on a third side of the passive element, and a fourth sub-region on a fourth side opposite the third side of the passive element,
wherein a roughness of a non-conductive upper surface of the package substrate in at least one of the first sub-region to the fourth sub-region is greater than a roughness of the non-conductive upper surface of the package substrate in the remaining region,
wherein the memory controller chip overlaps the non-conductive upper surface of the package substrate in the remaining region in plan view, and
wherein the flux layer is disposed on the non-conductive upper surface of the package substrate in the second sub-region of the peripheral region.

19. The semiconductor package as claimed in claim 18, wherein a width of the at least one of the first sub-region to the fourth sub-region along a direction perpendicular to a thickness direction of the package substrate is about 10 μm to about 500 μm.

20. The semiconductor package as claimed in claim 18, wherein a difference between the roughness of the non-conductive upper surface of the package substrate in the at least one of the first sub-region to the fourth sub-region and the roughness of the non-conductive upper surface of the package substrate in the remaining regions is 80 nm or more, and wherein the sealing portion contacts a top horizontal surface of the passive element connecting member.

* * * * *